(12) United States Patent
Joo et al.

(10) Patent No.: US 8,982,618 B2
(45) Date of Patent: *Mar. 17, 2015

(54) NONVOLATILE MEMORY DEVICE AND RELATED METHOD OF OPERATION

(71) Applicant: Samsung Electronics Co., Ltd., Suwon-Si, Gyeonggi-Do (KR)

(72) Inventors: Sang-Hyun Joo, Hwaseong-si (KR); Il-Han Park, Hwaseong-si (KR); Ki-Whan Song, Seoul (KR)

(73) Assignee: Samsung Electronics Co., Ltd., Suwon-si, Gyeonggi-do (KR)

( * ) Notice: Subject to any disclaimer, the term of this patent is extended or adjusted under 35 U.S.C. 154(b) by 0 days.

This patent is subject to a terminal disclaimer.

(21) Appl. No.: 13/795,750

(22) Filed: Mar. 12, 2013

(65) Prior Publication Data

US 2013/0336058 A1 Dec. 19, 2013

(30) Foreign Application Priority Data

Jun. 19, 2012 (KR) ........................ 10-2012-0065626

(51) Int. Cl.
*G11C 16/04* (2006.01)
*G11C 16/34* (2006.01)
*G11C 11/56* (2006.01)
*G11C 16/10* (2006.01)

(52) U.S. Cl.
CPC ........ *G11C 16/3418* (2013.01); *G11C 11/5628* (2013.01); *G11C 16/10* (2013.01)
USPC .................. 365/185.03; 365/222; 365/189.05

(58) Field of Classification Search
CPC ........... G11C 11/5628; G11C 11/5642; G11C 16/24; G11C 16/10
USPC ................................ 365/185.03, 189.05, 222
See application file for complete search history.

(56) References Cited

U.S. PATENT DOCUMENTS

| | | | |
|---|---|---|---|
| 2007/0237015 A1 | 10/2007 | Maejima et al. | |
| 2008/0031068 A1 | 2/2008 | Yoo et al. | |
| 2012/0275239 A1* | 11/2012 | Song ........................ | 365/189.05 |

FOREIGN PATENT DOCUMENTS

| | | |
|---|---|---|
| JP | 2002-260383 | 9/2002 |
| JP | 2010-186530 | 8/2010 |
| KR | 20-0252741 | 12/2001 |
| KR | 10-0421904 | 3/2004 |
| KR | 10-0476891 | 3/2005 |
| KR | 10-0495918 | 6/2005 |

* cited by examiner

*Primary Examiner* — Huan Hoang
(74) *Attorney, Agent, or Firm* — Volentine & Whitt, PLLC

(57) ABSTRACT

A nonvolatile memory device comprises a nonvolatile memory chip comprising a static latch, first and second dynamic latches that receive the data stored in the static latch through a floating node, and a memory cell configured to store multi-bit data. The nonvolatile memory device performs a refresh operation on the first dynamic latch where externally supplied first single bit data is stored in the first dynamic latch, performs a refresh operation on the second dynamic latch where externally supplied second single bit data is stored in the second dynamic latch, and programs the memory cell using the data stored in the first and second dynamic latches after the first and second single bit data are stored in the respective first and second dynamic latches.

19 Claims, 23 Drawing Sheets

NONVOLATILE MEMORY DEVICE AND RELATED METHOD OF OPERATION

CROSS-REFERENCE TO RELATED APPLICATIONS

This application claims priority under 35 U.S.C. 119 to Korean Patent Application No. 10-2012-0065626 filed on Jun. 19, 2012, the subject matter of which is hereby incorporated by reference.

BACKGROUND OF THE INVENTION

The inventive concept relates generally to electronic memory technologies. More particularly, certain embodiments of the inventive concept relate to nonvolatile memory devices and related methods of operation.

Nonvolatile memory devices often include a page buffer designed to temporarily store data being transferred to or from a memory cell array. The page buffer is typically implemented by a plurality of latches each designed to store one or more bits of data. In general, a latch can be either a static latch, which can retain stored data without requiring a refresh operation, or a dynamic latch, which requires a periodic refresh operation to retain stored data.

As electronic devices become smaller, there is a general demand to decrease the size, power consumption, and other aspects of memory devices and their constituent components, including page buffers. Accordingly, researchers are engaged in ongoing efforts to improve these and other aspects of memory devices, page buffers, latch circuits, and so on.

SUMMARY OF THE INVENTION

In one embodiment of the inventive concept, a nonvolatile memory device comprises a nonvolatile memory chip comprising a static latch, first and second dynamic latches that receive the data stored in the static latch through a floating node, and a memory cell configured to store multi-bit data. The nonvolatile memory device performs a refresh operation on the first dynamic latch where externally supplied first single bit data is stored in the first dynamic latch, performs a refresh operation on the second dynamic latch where externally supplied second single bit data is stored in the second dynamic latch, and programs the memory cell using the data stored in the first and second dynamic latches after the first and second single bit data are stored in the respective first and second dynamic latches.

In another embodiment of the inventive concept, a nonvolatile memory device comprises a nonvolatile memory chip comprising a static latch and a dynamic latch that receives data stored in the static latch through a floating node, wherein the dynamic latch comprises a storage capacitor, a write transistor that writes the data of the floating node to the storage capacitor, and a read transistor that reads the data of the storage capacitor, and the write transistor and the read transistor share the floating node.

In another embodiment of the inventive concept, a method of operating a nonvolatile memory device comprising a static latch and a dynamic latch comprises storing data in the static latch, and transferring the data stored in the static latch to the dynamic latch via a floating node, wherein the dynamic latch comprises a storage capacitor, a write transistor that writes the data of the floating node to the storage capacitor, and a read transistor that reads the data of the storage capacitor, and the write transistor and the read transistor share the floating node.

These and other embodiments of the inventive concept can potentially allow a latch to have reduced size and improved power efficiency.

BRIEF DESCRIPTION OF THE DRAWINGS

The drawings illustrate selected embodiments of the inventive concept. In the drawings, like reference numbers indicate like features.

DETAILED DESCRIPTION

Embodiments of the inventive concept are described below with reference to the accompanying drawings. These embodiments are provided as teaching examples and should not be construed to limit the scope of the inventive concept.

In the description that follows, where an element or layer is referred to as being "on" or "connected to" another element or layer, it can be directly on or connected to the other element or layer or intervening elements or layers may be present. In contrast, where an element is referred to as being "directly on" or "directly connected to" another element or layer, there are no intervening elements or layers present. As used herein, the term "and/or" includes any and all combinations of one or more of the associated listed items.

The use of the terms "a" and "an" and "the" and similar referents in the context of describing the inventive concept (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted.

Although the terms first, second, etc. may be used herein to describe various elements, these elements should not be limited by these terms. Rather, these terms are used merely to distinguish one element from another element. Thus, for example, a first element, a first component or a first section discussed below could be termed a second element, a second component or a second section without departing from the teachings of the inventive concept.

Unless defined otherwise, all technical and scientific terms used herein have the same meaning as commonly understood by one of ordinary skill in the art to which this invention belongs. The use of any and all examples, or exemplary terms provided herein is intended merely to better illuminate the invention and is not a limitation on the scope of the invention unless otherwise specified. Further, unless defined otherwise, all terms defined in generally used dictionaries may not be overly interpreted.

Figure 1:
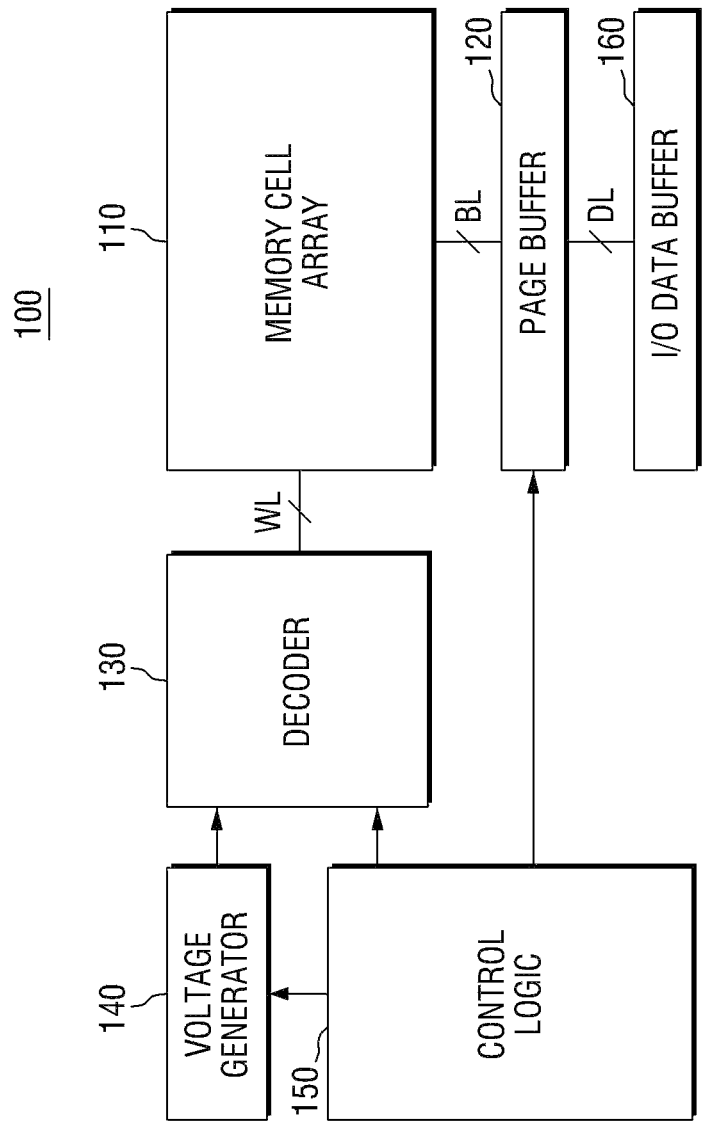
FIG. 1 is a block diagram of a memory device according to an embodiment of the inventive concept.

FIG. 1 is a block diagram of a memory device 100 according to an embodiment of the inventive concept. In the description that follows, it will be assumed that memory device 100 is a nonvolatile memory device, specifically a flash memory device. For example, memory device 100 may be either a NAND flash memory device or a NOR flash memory device. Nevertheless, the inventive concept is not limited to the described type of memory device. For example, in certain alternative embodiments, memory device 100 may be a phase-change random-access memory (PRAM), a magneto-resistive random-access memory (MRAM), or a resistive random-access memory (RRAM).

Referring to FIG. 1, memory device 100 comprises a memory cell array 110 comprising at least one memory cell (not shown). Each memory cell stores n-bit data, where n is greater than or equal to one. Memory cell array 110 is divided into a plurality of regions. In detail, memory cell array 110 comprises a data region in which ordinary data is stored and a spare region. Each region of memory cell array 110 comprises a plurality of memory blocks.

Memory device 100 further comprises a page buffer 120, a decoder 130, a voltage generator 140, control logic 150, and an input/output data buffer 160.

Page buffer 120 is configured to write data in a memory cell of memory cell array 110 under the control of control logic 150 and to read data from the memory cell. Here, page buffer 120 is a page buffer that can be miniaturized, as described below in further detail.

Decoder 130 is controlled by control logic 150 and is configured to select a memory block of memory cell array 110 and to select a word line WL of the selected memory block. Word line WL selected by decoder 130 is driven by a word line voltage generated by voltage generator 140.

Voltage generator 140 is controlled by control logic 150 and is configured to generate a word line voltage to be supplied to memory cell array 110. The word line voltage may be, for instance, a read voltage, a write voltage, a path voltage, a local voltage, or a verify voltage.

Input/output data buffer 160 receives a read result of page buffer 120 and then transmits the same to an external device and transfers the data received from the external device to page buffer 120. Control logic 150 is configured to control the overall operation of memory device 100.

Figure 2:
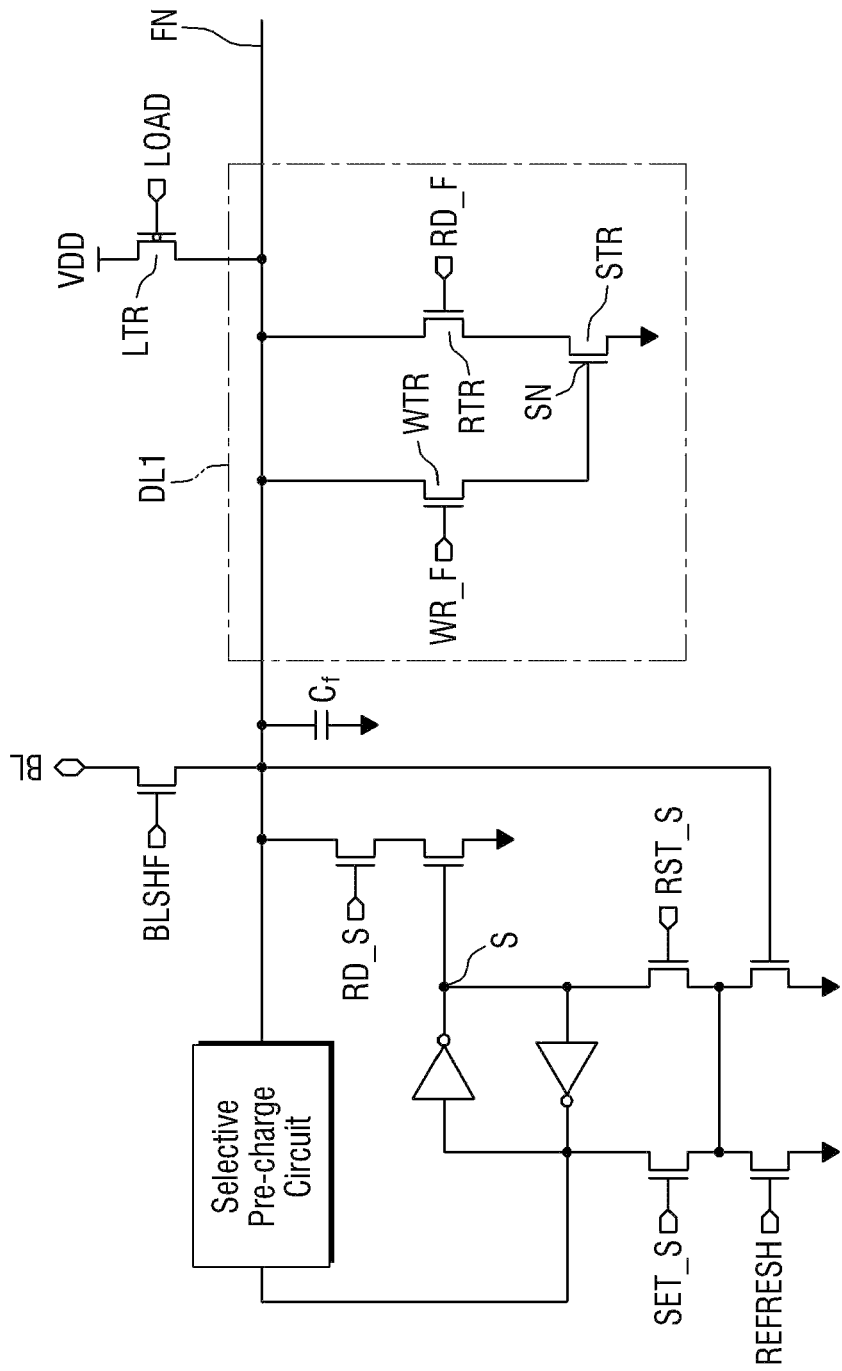
FIG. 2 is a circuit diagram of a page buffer according to an embodiment of the inventive concept.
Figure 3:
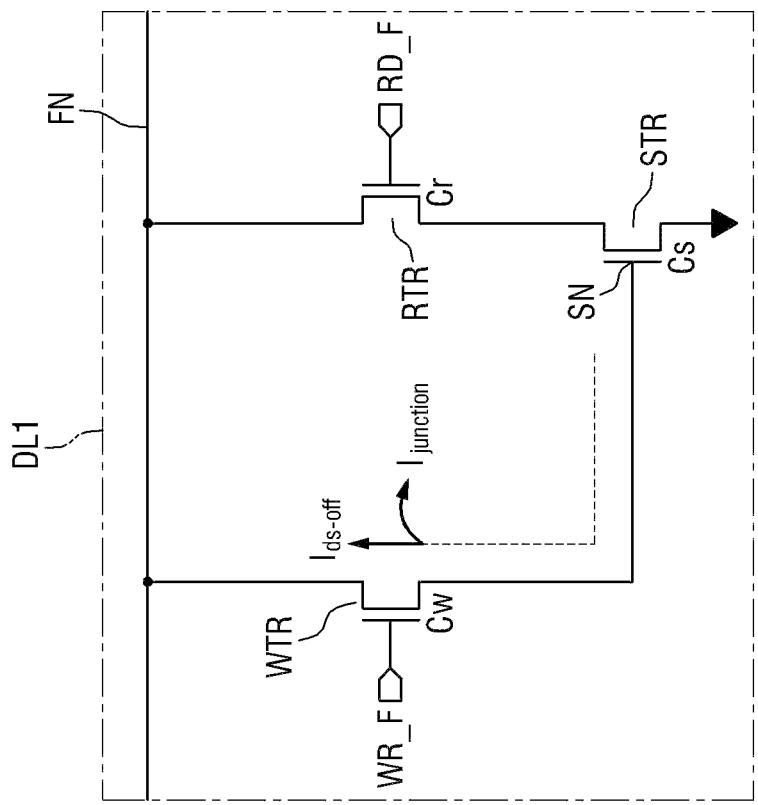
FIG. 3 is a circuit diagram of a dynamic latch according to an embodiment of the inventive concept.
Figure 4:
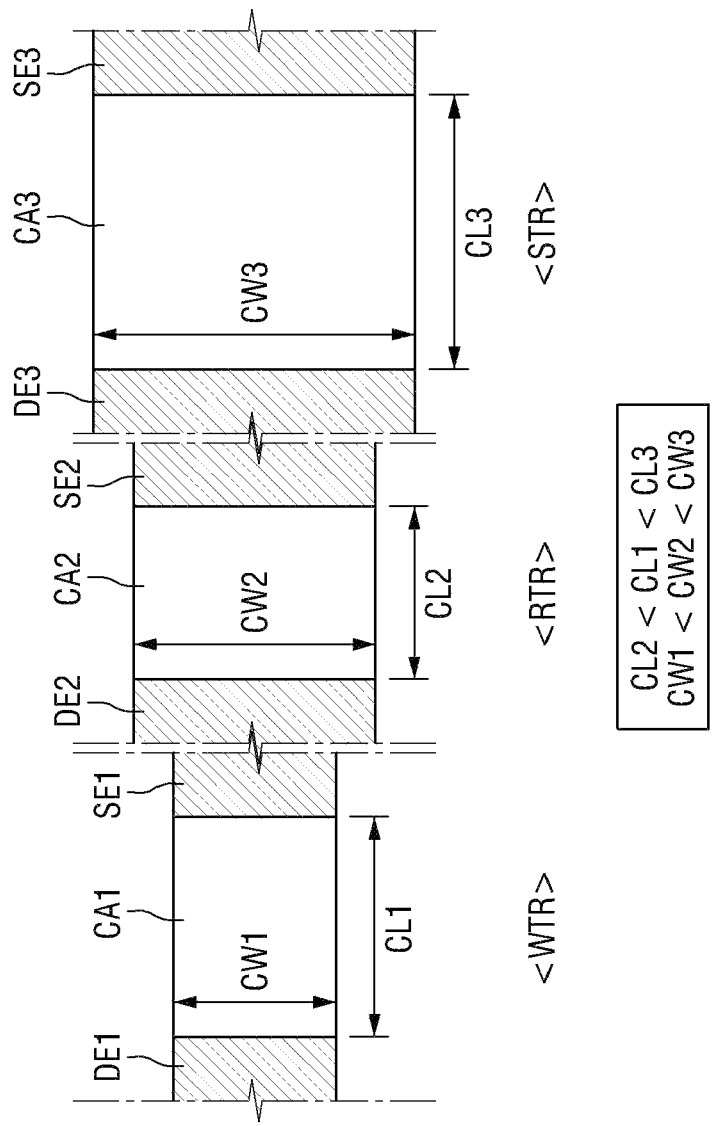
FIG. 4 is a diagram comparing sizes of a write transistor, a read transistor, and a storage transistor.

FIG. 2 is a circuit diagram of a page buffer according to an embodiment of the inventive concept, FIG. 3 is a circuit diagram of a dynamic latch according to an embodiment of the inventive concept, and FIG. 4 is a diagram comparing sizes of a write transistor, a read transistor, and a storage transistor. For explanation purposes, it will be assumed that the page buffer of FIG. 2 is page buffer 120 of FIG. 1.

Referring to FIGS. 2 and 3, page buffer 120 comprises a static latch S in which data received from an external device is stored prior to storage in memory cell array 110, and a dynamic latch DL1 that receives the data stored in static latch S through a floating node FN.

Static latch S and dynamic latch DL1 are used to transmit the data stored in a memory cell of memory cell array 110 to input/output data buffer 180 or to program the data received from input/output data buffer 180 in the memory cell. While FIG. 2 shows circuit diagram of a page buffer including an inverter, a plurality of control transistors, a static latch S, and a dynamic latch DL1, the inventive concept is not limited thereto. For instance, a connection method of static latch S and dynamic latch DL1 may vary in alternative embodiments.

Dynamic latch DL1 comprises a floating node FN, a storage node SN, a write transistor WTR and a read transistor RTR. Write transistor WTR and read transistor RTR share a floating node FN as shown in FIG. 2. In particular, write transistor WTR is directly connected to floating node FN, and read transistor RTR is also directly connected to floating node FN. In further detail, a first electrode (e.g., a drain electrode) of write transistor WTR is directly connected to floating node FN, and a first electrode (e.g., a drain electrode) of read transistor RTR is also directly connected to floating node FN.

Meanwhile, a second electrode (e.g., a source electrode) of write transistor WTR is connected to a storage node SN. Here, write transistor WTR writes the data of floating node FN to storage node SN according to a write signal WR_F of the gate electrode of write transistor WTR. In particular, write transistor WTR transfers some charges from floating node FN to storage node SN according to write signal WR_F of the gate electrode of write transistor WTR.

In some embodiments, storage node SN is implemented using a gate capacitor of a transistor. For instance, storage node SN may be implemented using a gate capacitor of a storage transistor STR having a gate electrode connected to write transistor WTR and a first electrode (e.g., a drain electrode) connected to read transistor RTR. In other words, storage node SN may be a storage capacitor comprising a gate electrode, a gate insulation film, and source and drain electrodes of a storage transistor STR having predetermined capacitance Cs. Meanwhile, a second electrode (e.g., a source electrode) of storage transistor STR is connected to a ground terminal, as shown in the drawing.

A second electrode (e.g., a source electrode) of read transistor RTR is connected to the first electrode (e.g., drain electrode) of storage transistor STR. Read transistor RTR reads data of storage node SN. In detail, where a read signal RD_F is applied to the gate electrode of read transistor RTR, read transistor RTR changes a level of the charge of floating node FN according to the level of the charge of storage node SN, thereby reading the data of storage node SN. Therefore, the data of floating node FN is written to storage node SN through write transistor WTR, or floating node FN remains in a floating state while the data of storage node SN is read.

Meanwhile, a charge source that supplies charges to floating node FN is further connected to floating node FN. The charge source comprises a load transistor LTR, as shown. In detail, load transistor LTR comprises a first electrode (e.g., source electrode) connected to a power source terminal VDD and a second electrode (e.g., drain electrode) connected to floating node FN. Load transistor LTR supplies charges received from power source terminal VDD to floating node FN according to a load signal LOAD applied to the gate electrode.

Write transistor WTR, read transistor RTR, and storage transistor STR may all be implemented by NMOS transistors and load transistor LTR may be implemented by a PMOS transistor, but the inventive concept are not limited thereto. For example, in certain alternative embodiments, write transistor WTR, read transistor RTR, and storage transistor STR may all be implemented by PMOS transistors and load transistor LTR may be implemented by an NMOS transistor. Here, the first electrode of storage transistor STR may be connected to the power supply terminal VDD and the first electrode of load transistor LTR may be connected to a ground terminal.

Storage transistor STR typically has a size different from that of write transistor WTR or read transistor RTR. In detail, storage transistor STR may be larger than write transistor WTR or read transistor RTR, as described below with reference to FIGS. 3 and 4.

FIG. 4 illustrates of a source electrode SE3 and a drain electrode DE3 of a storage transistor STR, source electrodes SE1 and SE2 and drain electrodes DE1 and DE2 of a write transistor WTR and a read transistor RTR. Gate electrodes (not shown) of respective transistor STR, WTR and RTR are typically formed to overlap source electrodes SE1 to SE3 and drain electrodes DE1 to DE3 over source electrodes SE1 to SE3 and drain electrodes DE1 to DE3.

Referring to FIG. 4, storage transistor STR has a size greater than that of write transistor WTR or read transistor RTR. Source electrode SE3 of storage transistor STR is larger than source electrode SE1 or SE2 of write transistor WTR or read transistor RTR, while drain electrode DE3 of storage transistor STR is larger than drain electrode DE1 or DE2 of write transistor WTR or read transistor RTR. In addition, a channel section area CA3 surrounded by source electrode SE3 and drain electrode DE3 of storage transistor STR is also greater than a channel section area CA1 or CA2 of write transistor WTR or read transistor RTR.

Channel section area CA3 of storage transistor STR is greater than that of channel section area CA1 or CA2 of write transistor WTR or read transistor RTR because a channel length CL3 of storage transistor STR is greater than a channel length CL1 or CL2 of write transistor WTR or read transistor RTR, or a channel width CW3 of storage transistor STR is greater than a channel width CW1 or CW2 of write transistor WTR or read transistor RTR. In particular, in some embodiments of the inventive concept, both of channel length CL3 and channel width CW3 of storage transistor STR may be greater than channel length CL1 or CL2 and channel width CW1 or CW2 of write transistor WTR or read transistor RTR.

Storage transistor STR is typically formed to be larger than write transistor WTR or read transistor RTR for the purpose of forming a large-sized storage capacitor used as a storage node SN. A capability of storing data (e.g., charge) of storage node SN can be increased by making the storage capacitor large.

In some embodiments of the inventive concept, channel length CL1 of write transistor RTR is greater than channel length CL2 of read transistor RTR. In addition, in some other embodiments, channel width CW1 of write transistor RTR is smaller than channel width CW2 of read transistor RTR. As described above, channel length CL1 of write transistor RTR is made to be greater than channel length CL2 of read transistor RTR and channel width CW1 of write transistor RTR is made to be smaller than channel width CW2 of read transistor RTR for the purpose of minimizing disturbance of the storage capacitor used as storage node SN.

Referring again to FIG. 3, the data (e.g., charge) stored in storage node SN may be leaked in a direction in which it passes through write transistor WTR (i.e., in a direction indicated by a dotted line shown in FIG. 3) according to passage of time, thereby generating a leakage current. The leakage current passing through write transistor WTR typically comprises a source-drain leakage current $I_{ds\text{-}off}$ flowing via the source and drain of write transistor WTR, and a junction leakage current $I_{junction}$ flowing from a junction of the source and channel region of write transistor WTR to a body of write transistor WTR.

Channel length CL1 of write transistor WTR is made to be large, thereby minimizing the source-drain leakage current $I_{ds\text{-}off}$, while channel width CW1 of write transistor WTR is made to be small, thereby minimizing the junction leakage current $I_{junction}$. Therefore, with the configuration described above, the disturbance of the storage capacitor used as storage node SN can be minimized, thereby improving the data (e.g., charge) storage capability of storage node SN.

Figure 5:
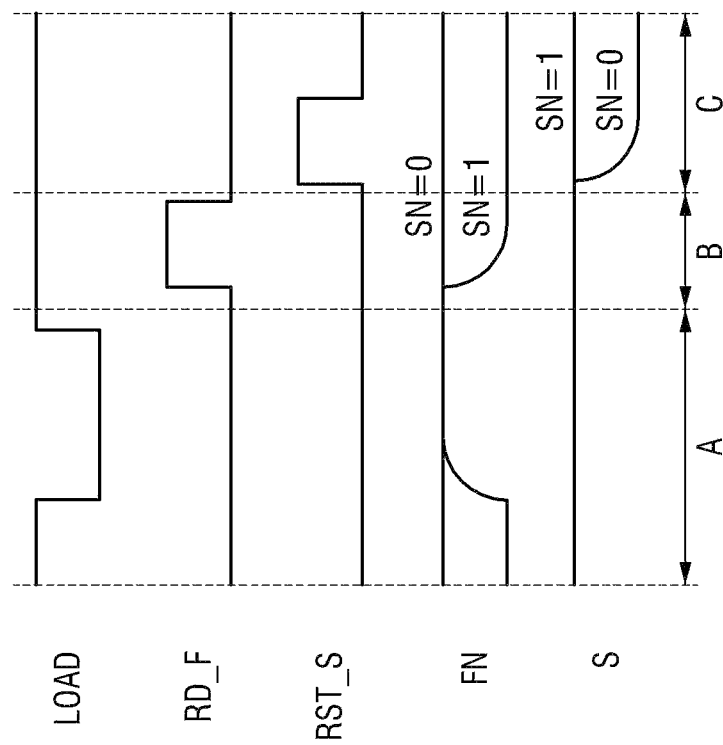
FIG. 5 is a waveform timing diagram illustrating a write operation of the page buffer of FIG. 2.
Figure 6:
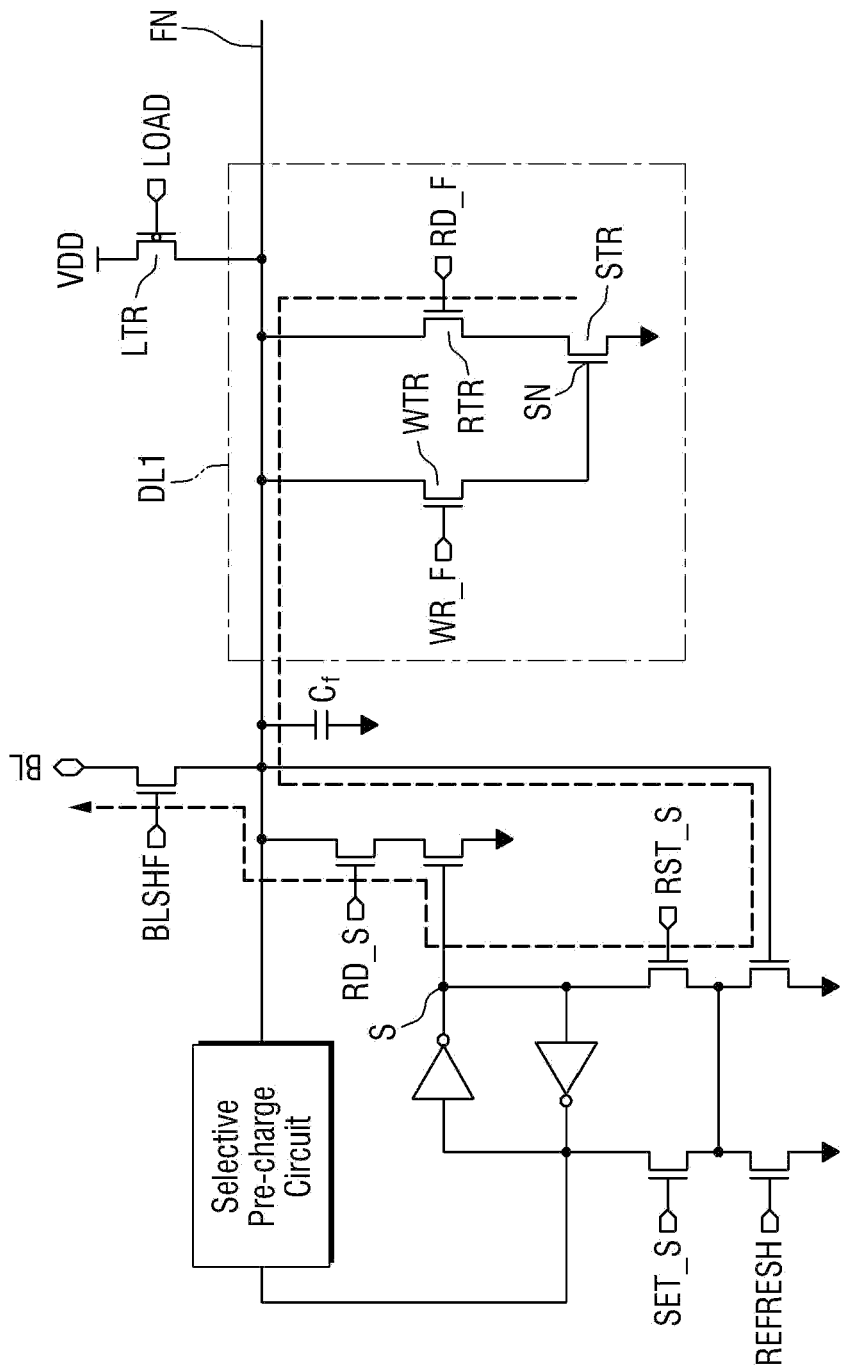
FIG. 6 is a circuit diagram illustrating the write operation of FIG. 5.

FIGS. 5 and 6 illustrate a write operation of the page buffer of FIG. 2.

Referring to FIGS. 5 and 6, data is provided from an external device (e.g., input/output data buffer 160 of FIG. 1) and is stored in storage node SN of a dynamic latch DL1. Write transistor WTR is used to store the data in storage node SN.

As shown in FIGS. 5 and 6, a load transistor LTR is turned on in response to a load signal LOAD is applied thereto. Once load transistor LTR is turned on, charges are supplied from a power source terminal VDD to a floating node FN, and high level data (e.g., 1) is stored in floating node FN (i.e., in an A section).

Next, as shown in FIGS. 5 and 6, read transistor RTR is turned on in response to a read signal RD_F. Here, floating node FN is developed according to the data stored in storage node SN, so that different levels of data are stored in floating node FN (section "B"). Under these circumstances, if high level data (e.g., 1) is stored in storage node SN, storage transistor STR is turned on. Here, where read transistor RTR is turned on by read signal RD_F, floating node FN is connected to a ground terminal. Accordingly, because the charges of floating node FN are all discharged to the ground terminal, no charge remains in floating node FN. Therefore, low level data (e.g., 0) is stored in floating node FN. On the other hand, if low level data (e.g., 0) is stored in storage node SN, storage transistor STR is turned off. Here, where read transistor RTR is turned on by read signal RD_F, floating node FN is not connected to the ground terminal and still remains at a floating state. Accordingly, the high level data (e.g., 1) is stored in floating node FN.

The high level data (e.g., 1) stored in storage node SN is changed in its data level to then be stored in floating node FN as low level data (e.g., 0), while the low level data (e.g., 0) stored in storage node SN is changed in its data level to then be stored in floating node FN as high level data (e.g., 1).

Where reset signal RST_S is applied to static latch S, static latch S is developed according to the data stored in floating node FN, so that different levels of data are stored in static latch S (section "C"). Under these circumstances, if high level data (e.g., 1) is stored in floating node FN, a transistor serially connected to a transistor to which reset signal RST_S is applied is turned on. Therefore, the charges of floating node FN are all discharged to the ground terminal, and low level data (e.g., 0) is stored in static latch S when reset signal RST_S is applied thereto. On the other hand, if low level data (e.g., 0) is stored in floating node FN, a transistor serially connected to a transistor to which reset signal RST_S is applied is turned off. Therefore, the charges of floating node FN are transmitted to static latch S when reset signal RST_S is applied thereto, and the high level data (e.g., 0) is stored in static latch S. In other words, the high level data (e.g., 1) stored in floating node FN is changed in its data level to then be stored in static latch S as low level data (e.g., 0), while the low level data (e.g., 0) stored in floating node FN is changed in its data level to then be stored in static latch S as high level data (e.g., 1).

The data stored in storage node SN may be changed in its data level to then be stored in floating node FN, while the data stored in floating node FN may be changed in its data level to then be stored in static latch S.

Figure 7:
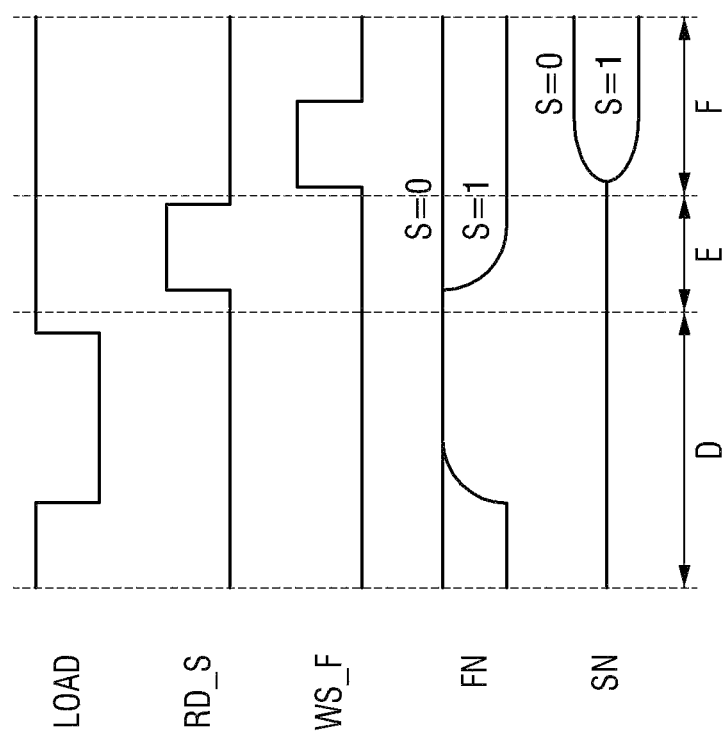
FIG. 7 is a waveform timing diagram illustrating a read operation of the page buffer of FIG. 2.
Figure 8:
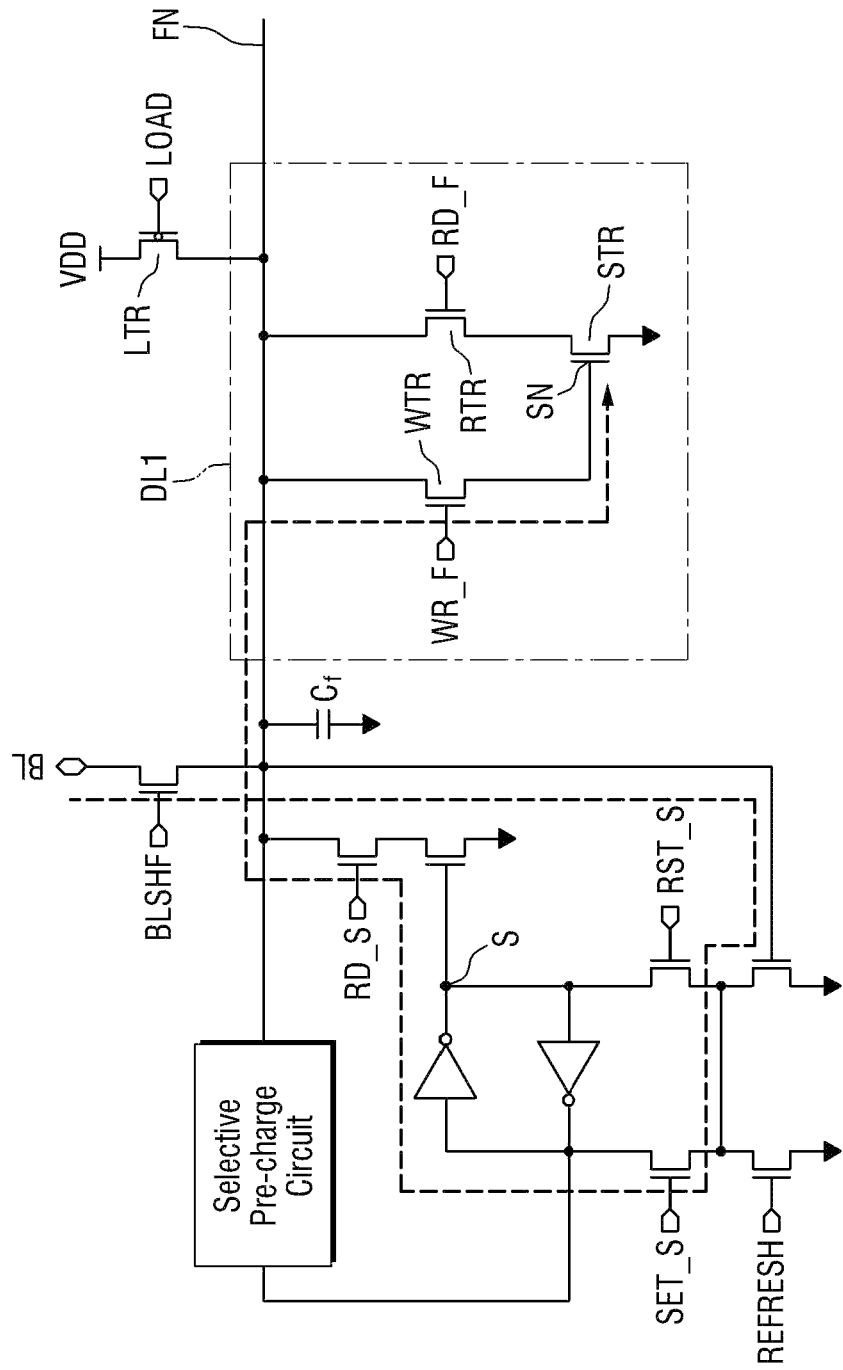
FIG. 8 is a circuit diagram illustrating the read operation of FIG. 7.

FIGS. 7 and 8 illustrate a read operation of the page buffer of FIG. 2.

Referring to FIGS. 7 and 8, data stored in a memory cell in memory cell array 110 is first stored in static latch S through bit line BL. While FIG. 8 illustrates an embodiment in which the data stored in a memory cell is stored in static latch S through a bit line BL, the inventive concept is not limited thereto.

As shown in FIGS. 7 and 8, where a load signal LOAD is applied to a load transistor LTR, load transistor LTR is turned on. Once load transistor LTR is turned on, charges are supplied from a power source terminal VDD to a floating node FN, so that high level data (e.g., 1) is stored in floating node FN (section "D").

Next, as shown in FIGS. 7 and 8, where a read signal RD_S is applied to static latch S, floating node FN is developed according to the data stored in static latch S, so that different levels of data are stored in floating node FN (i.e., in an E section).

Under these circumstances, if high level data (e.g., 1) is stored in static latch S, as read signal RD_S is applied to static latch S, floating node FN is connected to a ground terminal. Because the charges of floating node FN are all discharged to the ground terminal, no charge remains in floating node FN. Therefore, low level data (e.g., 0) is stored in floating node FN. On the other hand, if low level data (e.g., 0) is stored in static latch S, even if read signal RD_S is applied to static latch S, floating node FN is not connected to the ground terminal and still remains at a floating state. Accordingly, the high level data (e.g., 0) is stored in floating node FN. The high level data (e.g., 1) stored in static latch S is changed in its data level to then be stored in floating node FN as low level data (e.g., 0), while the low level data (e.g., 0) stored in static latch S is changed in its data level to then be stored in floating node FN as high level data (e.g., 1).

Where a write signal WR_F is applied to a write transistor WTR, write transistor WTR is turned on, and storage node SN is developed according to the data stored in floating node FN, so that different levels of data are stored in storage node SN (i.e., in an F section). Under these circumstances, if high level data (e.g., 1) is stored in floating node FN, write transistor WTR is turned on. Therefore, the charges of floating node FN are shared according to the ratio of capacitance Cf of floating node FN to capacitance Cs of the storage capacitor, so that high level data (e.g., 1) is stored in storage node SN. Capacitance Cf of floating node FN is typically greater than capacitance Cs of the storage capacitor. On the other hand, if low level data (e.g., 0) is stored in floating node FN, write transistor WTR is turned on and floating node FN is connected to storage node SN and the low level data (e.g., 1) is stored in storage node SN.

The high level data (e.g., 1) stored in floating node FN is not changed in its data level to then be stored in storage node SN as still high level data (e.g., 1), while the low level data (e.g., 0) stored in floating node FN is not changed in its data level to then be stored in storage node SN as still low level data (e.g., 0). In other words, the data stored in static latch S is changed in its data level to then be stored in floating node FN, while the data stored in floating node FN is not changed in its data level to then be stored in storage node SN. Therefore, the data stored in static latch S is changed in its data level to then be stored in storage node SN.

As indicated above, the page buffer exchanges data through charge sharing while static latch S and dynamic latch DL1 share floating node FN. Therefore, a separate component (e.g., a separate latch) is not additionally required to transfer data, allowing the page buffer to be formed in a relatively compact form.

Figure 9:
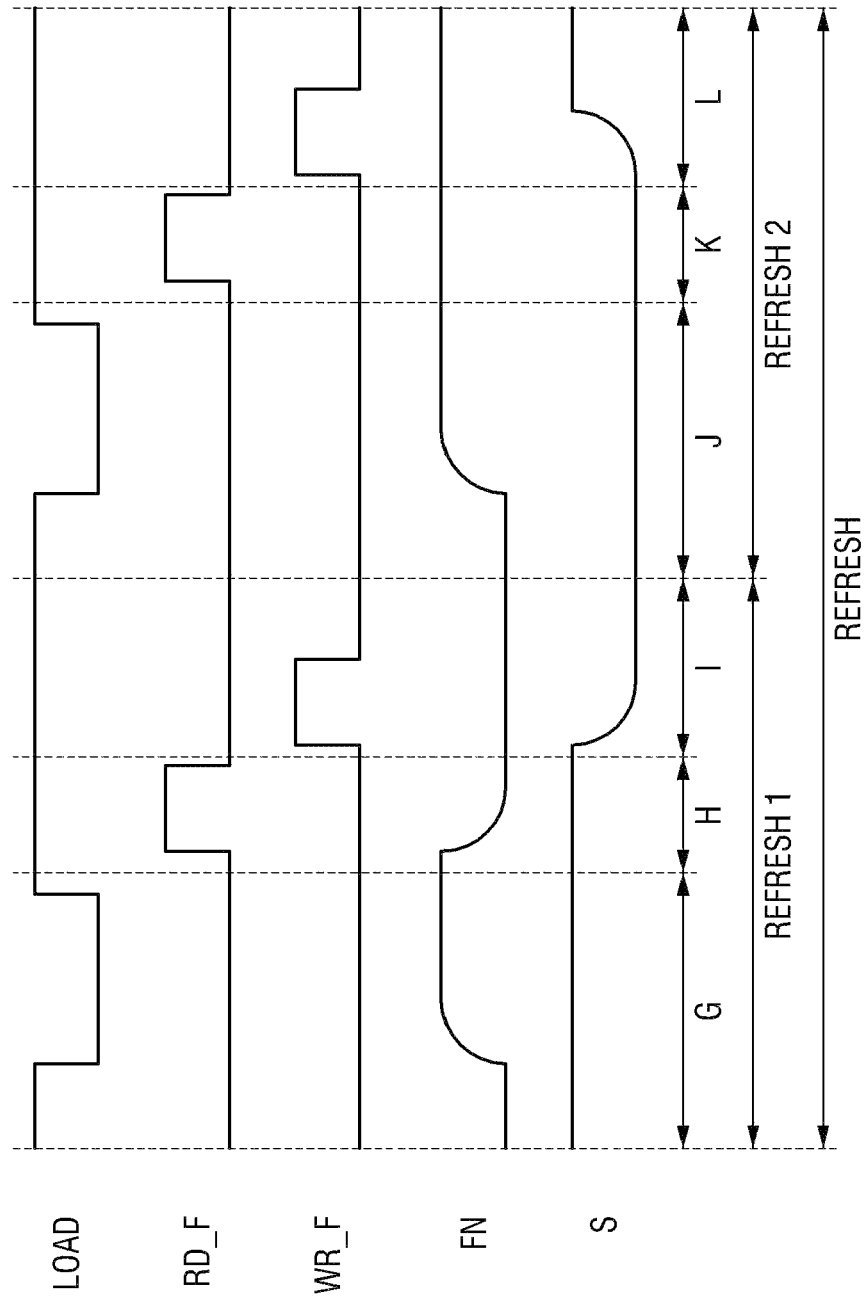
FIG. 9 is a waveform timing diagram illustrating a refresh operation of the page buffer of FIG. 2.
Figure 10:
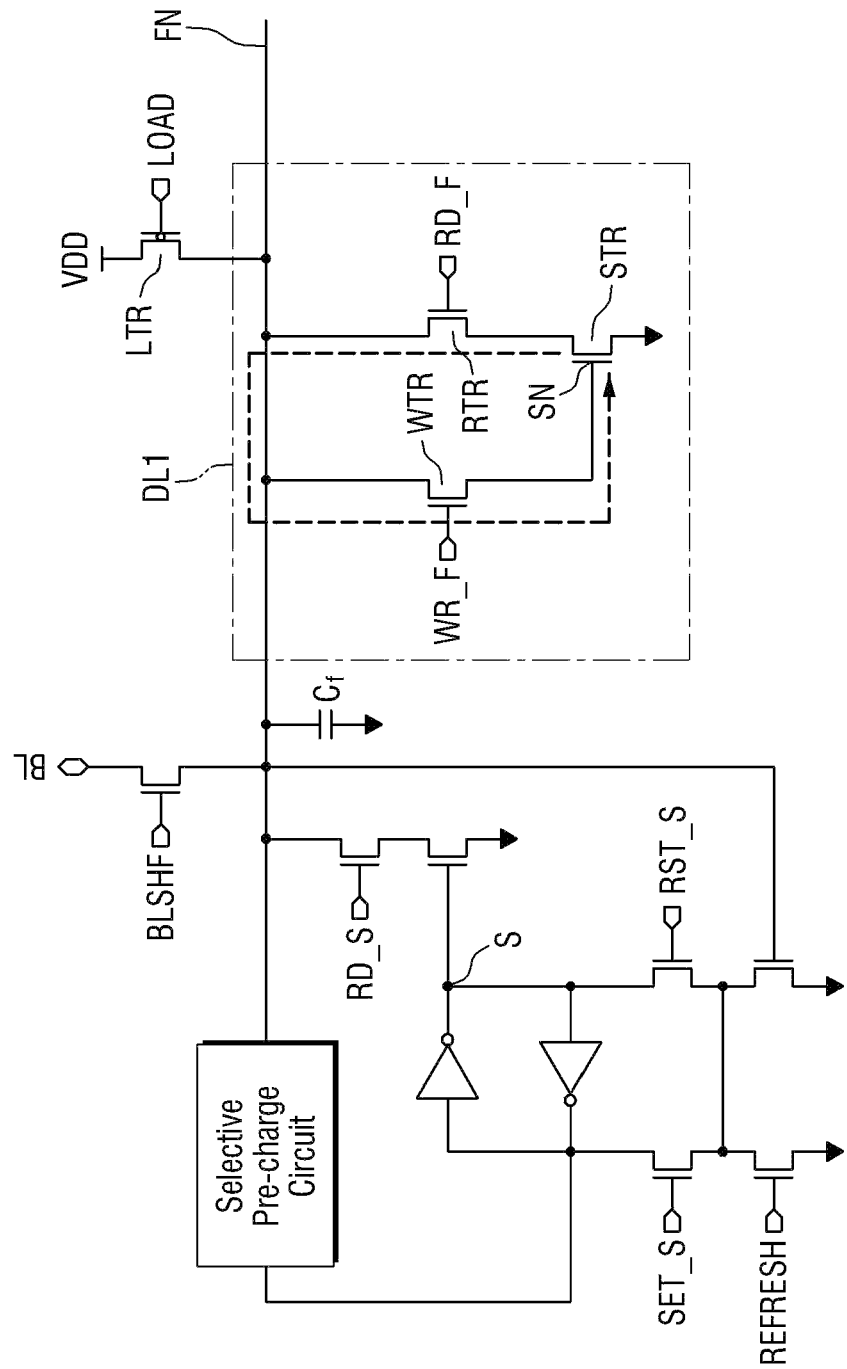
FIG. 10 is a circuit diagram illustrating the refresh operation of FIG. 9.

FIGS. 9 and 10 illustrate a refresh operation of the page buffer of FIG. 2.

Referring to FIGS. 9 and 10, as described above, because the page buffer comprises a dynamic latch DL1, periodic refresh operations are required to use data stored in dynamic latch DL1. The refresh operations of the page buffer comprise a first refresh operation REFRESH 1 and a second refresh operation REFRESH 2, as shown. First refresh operation REFRESH 1 will first be described.

Where a load signal LOAD is applied to load transistor LTR, load transistor LTR is turned on. Once load transistor LTR is turned on, charges are supplied from a power source terminal VDD to a floating node FN, so that high level data (e.g., 1) is stored in floating node FN (section "G").

Next, where a read signal RD_F is applied to read transistor RTR, read transistor RTR is turned on. Here, floating node FN is developed according to the data stored in storage node SN, so that different levels of data are stored in floating node FN (section "H"). For example, as shown, if high level data (e.g., 1) is stored in storage node SN, storage transistor STR is turned on. Here, when read transistor RTR is turned on by read signal RD_F, floating node FN is connected to a ground terminal. In this case, because the charges of floating node FN are all discharged to the ground terminal, no charge remains in floating node FN. Therefore, low level data (e.g., 0) is stored in floating node FN. Where low level data (e.g., 0) is stored in storage node SN, the read and write operations of the page buffer can be understood from the above description of various embodiments.

Next, where a write signal WR_F is applied to write transistor WTR to turn on write transistor WTR, write transistor WTR is turned on. Here, storage node SN is developed according to the data stored in floating node FN, so that different levels of data are stored in floating node FN (section "I"). For example, as shown, if low level data (e.g., 0) is stored in floating node FN, write transistor WTR is turned on, so that floating node FN and storage node SN are connected to each other, thereby storing low level data (e.g., 0) in storage node SN. Where high level data (e.g., 1) is stored in floating node FN, the read and write operations of the page buffer can be understood from the above description of various embodiments.

Through the above-described process, where a first refresh operation REFRESH 1 is completed, the high level data (e.g., 1) stored in storage node SN is changed into low level data (e.g., 0). Therefore, to restore the level of the data stored in storage node SN, a second refresh operation REFRESH 2 is required. Second refresh operation REFRESH 2 of the page buffer according to the embodiment of the inventive concept will now be described. Referring still to FIGS. 9 and 10, where load signal LOAD is applied to load transistor LTR, load transistor LTR is turned on. Once load transistor LTR is turned on, charges are supplied from power source terminal VDD to floating node FN, so that high level data (e.g., 1) is stored in floating node FN (section "J").

Next, where read signal RD_F is applied to read transistor RTR, read transistor RTR is turned on. Here, floating node FN is developed according to the data stored in storage node SN, so that different levels of data are stored in floating node FN (section "K"). For example, as shown, if low level data (e.g., 0) is stored in storage node SN, storage transistor STR is turned off. Here, where read transistor RTR is turned on by read signal RD_F, floating node FN is not connected to a ground terminal but remains floated. Under these circumstances, because the charges of floating node FN are all discharged to the ground terminal, no charge remains in floating node FN. Therefore, still high level data (e.g., 1) is stored in floating node FN.

Next, where write signal WR_F is applied to write transistor WTR to turn on write transistor WTR, so that storage node SN is developed according to the data stored in floating node FN (section "L"). For example, as shown, if high level data (e.g., 1) is stored in floating node FN, write transistor WTR is turned on, so that floating node FN and storage node SN are connected to each other, thereby storing high level data (e.g., 1) in storage node SN.

Through first refresh operation REFRESH 1 and second refresh operation REFRESH 2, the high level data (e.g., 1) stored in storage node SN is stored therein as high level data (e.g., 1), and the low level data (e.g., 0) stored in storage node SN is stored therein as low level data (e.g., 0).

Figure 11:
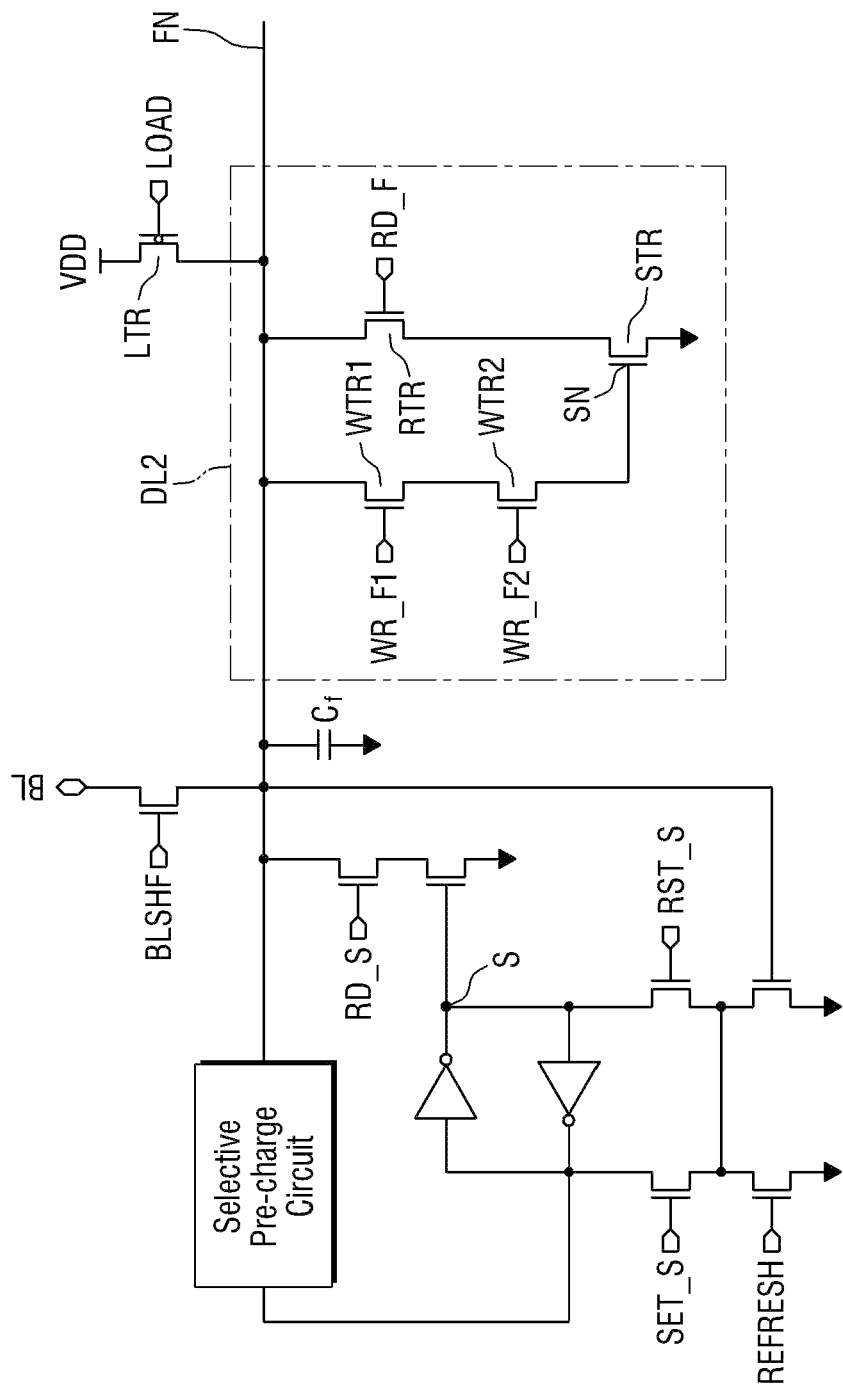
FIG. 11 is a circuit diagram of a page buffer according to another embodiment of the inventive concept.

FIG. 11 is a circuit diagram of a page buffer according to another embodiment of the inventive concept.

Referring to FIG. 11, the page buffer comprises a dynamic latch DL2 having a different configuration from the dynamic latch of FIG. 2. In particular, dynamic latch DL2 comprises two or more write transistors WTR1 and WTR2. While only two write transistors WTR1 and WTR2 are shown in the illustrated embodiment, the inventive concept is not limited thereto. For example, in some embodiments, the number of write transistors may be increased.

The two or more write transistors WTR1 and WTR2 are connected to each other in series. In particular, a first electrode (e.g., a drain electrode) of first write transistor WTR1 is connected to floating node FN, and a second electrode (e.g., a source electrode) of first write transistor WTR1 is connected to a first electrode (e.g., a drain electrode) of second write transistor WTR2. A second electrode (e.g., a source electrode) of second write transistor WTR2 is connected to the gate electrode of storage transistor STR. Write transistors WTR1 and WTR2 are turned on or off by first and second write signals WR_$F_1$ and WR_F2.

Where the two or more write transistors WTR1 and WTR2 are connected to each other in series, channels of write transistors WTR1 and WTR2 can be increased, thereby lowering the above-described source-drain leakage current ($I_{ds\text{-}off}$ of FIG. 3).

Figure 12:
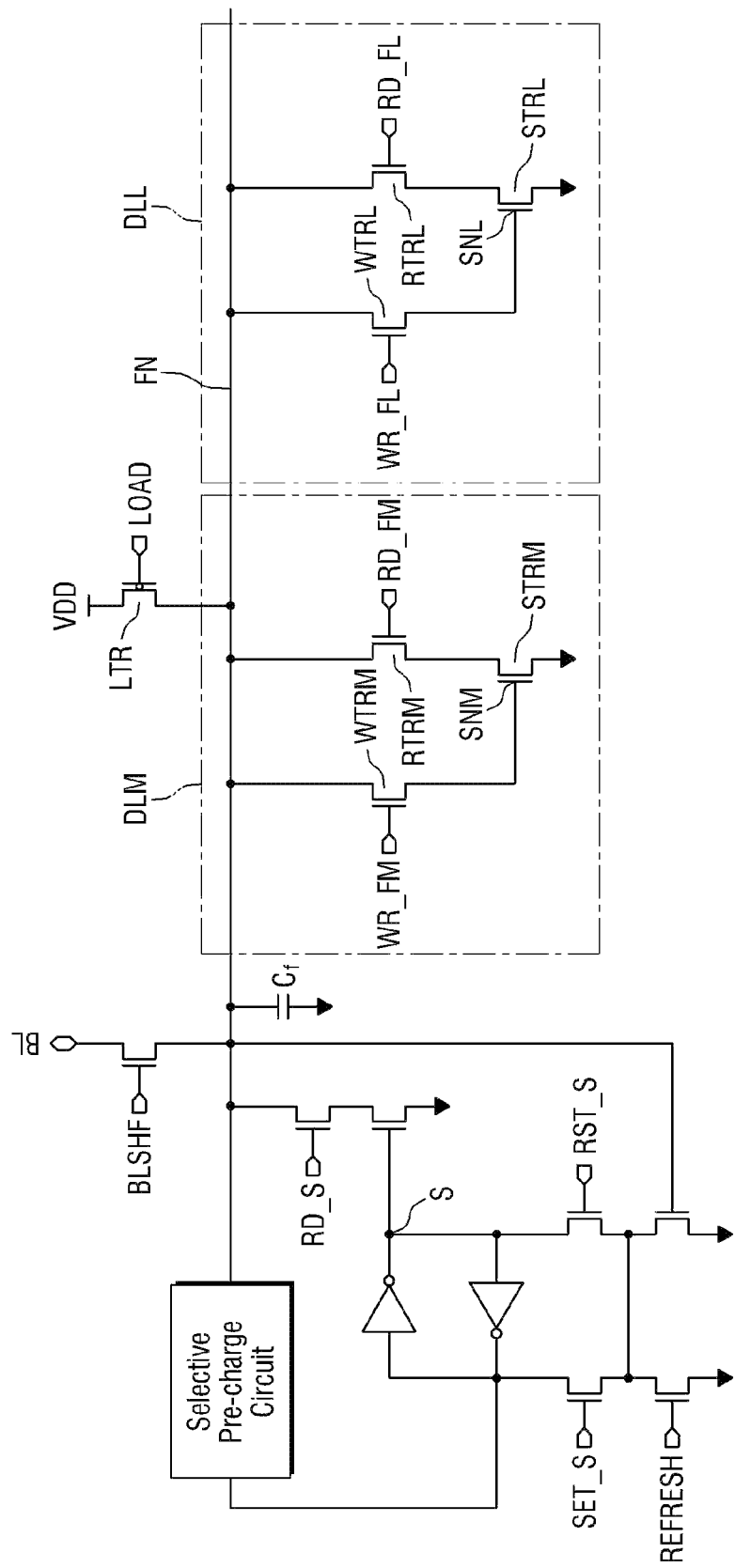
FIG. 12 is a circuit diagram of a page buffer according to still another embodiment of the inventive concept.

FIG. 12 is a circuit diagram of a page buffer according to still another embodiment of the inventive concept.

Referring to FIG. 12, the page buffer comprises a static latch S, a first dynamic latch DLM and a second dynamic latch DLL. The page buffer is connected to a memory cell array (e.g., memory cell array 110) comprising a multi-bit memory cell storing first bit (e.g., MSB) data and a second bit (e.g., LSB) data.

Static latch S receives the first bit (e.g., MSB) data and the second bit (e.g., LSB) data from the multi-bit memory cell and stores the same. First dynamic latch DLM receives the first bit data stored in static latch S through floating node FN, and second dynamic latch DLL receives the second bit data stored in static latch S through floating node FN.

On the other hand, first dynamic latch DLM receives first single bit data from an input/output data buffer (e.g., input/output data buffer 160 of FIG. 1) and then stores the same as the first bit data of the multi-bit memory cell, and the second dynamic latch DLL receives second single bit data from the input/output data buffer and then stores the same as the second bit data of the multi-bit memory cell. Static latch S receives the data stored in the first dynamic latch DLM and the second dynamic latch DLL through floating node FN, and the received data is used in programming the multi-bit memory cell included in the memory cell array.

Specific configurations of the first and second dynamic latches DLM and DLL are substantially the same as those of the previous embodiments, and detailed description thereof is thus omitted.

Although FIG. 12 illustrates that the page buffer comprises a first dynamic latch DLM receiving first bit data and a second dynamic latch DLL receiving second bit data, aspects of the inventive concept are not limited thereto, and the numbers of dynamic latches DLM and DLL may be increased. For example, in some other embodiments, the page buffer may be modified to include a first dynamic latch DLM receiving first bit (e.g., MSB) data, a second dynamic latch (not shown) receiving second bit (e.g., CSB) data, and a third dynamic latch DLL receiving third bit (e.g., LSB) data.

Figure 13:
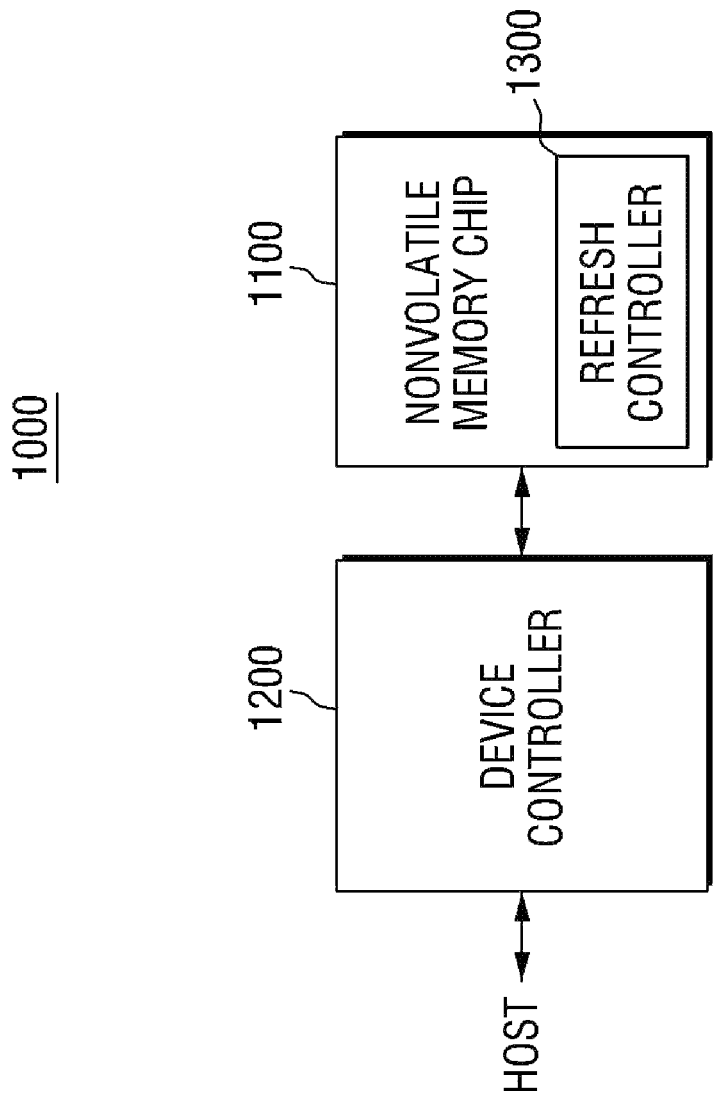
FIG. 13 is a block diagram of a nonvolatile memory device according to an embodiment of the inventive concept.

FIG. 13 is a block diagram of a nonvolatile memory device 1000 according to an embodiment of the inventive concept.

Referring to FIG. 13, nonvolatile memory device 1000 comprises a nonvolatile memory chip 1100, a device controller 1200, and a refresh controller 1300.

Nonvolatile memory chip 1100 comprises a page buffer as described above in relation to one of various embodiments. As indicated above, such a page buffer typically comprises a static latch and a dynamic latch receiving the data stored in the static latch through a floating node. A configuration of nonvolatile memory chip 1100 is substantially the same as that shown in FIG. 1.

Device controller 1200 is connected to a host and nonvolatile memory chip 1100. Device controller 1200 controls the operation of nonvolatile memory chip 1100. For example, device controller 1200 may access nonvolatile memory device 1100 in response to a request from the host. Device controller 1200 is generally configured to control read, write, erase and background operations of nonvolatile memory device 1100.

Device controller 1200 is configured to implement a protocol for interacting between nonvolatile memory device 1100 and the host. Device controller 1200 is configured to drive firmware for controlling nonvolatile memory device 1100.

Device controller 1200 typically comprises additional components such as a random access memory (RAM), a processing unit, a host interface, and a memory interface. The RAM may be used as at least one of an operation memory of the processing unit, a cache memory between nonvolatile memory device 1100 and the host, and a buffer memory between nonvolatile memory device 1100 and the host. The processing unit may be configured to control the overall operation of device controller 1200.

The host interface implements a protocol for performing the exchange of data between a host and device controller 1200. In various alternative embodiments, device controller 1200 may be configured to communicate with an external host using one or more data protocols, such as a universal serial bus (USB), multimedia card (MMC), peripheral component interconnect (PCI), peripheral component interconnect express (PCI-E), advanced technology attachment (ATA), serial-ATA, parallel-ATA, small computer system interface (SCSI), enhanced small disk interface (ESDI), and integrated drive electronics (IDE). The memory interface typically implements a protocol for interacting with nonvolatile memory device 1100. For example, the memory interface includes an NAND interface or a NOR interface.

Nonvolatile memory device 1000 may further comprise an ECC block. The ECC block is configured to detect and correct errors of data read from nonvolatile memory device 1100. In some embodiments, the ECC block is provided as part of controller 1200. The ECC block may be provided as part of nonvolatile memory device 1100.

Device controller 1200 and nonvolatile memory device 1100 can be commonly integrated within a single integrated circuit device. For example, in some embodiments, device controller 1200 and nonvolatile memory device 1100 are integrated in a memory card, such as a PC card (PCMCIA), a compact flash card (CF), a smart media card (SM/SMC), a memory stick, a multimedia card (MMC, RS-MMC, MMC-micro), an SD card (SD, miniSD, microSD), or a universal flash memory device (UFS). Alternatively, device controller 1200 and nonvolatile memory chip 1100 may be integrated to form a solid state drive/disk (SSD).

Nonvolatile memory chip 1100 or nonvolatile memory device 1000 can be mounted into various packages such as Package on Package (PoP), Ball grid arrays (BGAs), Chip scale packages (CSPs), Plastic Leaded Chip Carrier (PLCC), Plastic Dual In Line Package (PDIP), Die in Waffle Pack, Die in Wafer Form, Chip On Board (COB), Ceramic Dual In Line Package (CERDIP), Plastic Metric Quad Flat Pack (MQFP), Thin Quad Flatpack (TQFP), Small Outline (SOIC), Shrink Small Outline Package (SSOP), Thin Small Outline (TSOP), Thin Quad Flatpack (TQFP), System In Package (SIP), Multi Chip Package (MCP), Wafer-level Fabricated Package (WFP), Wafer-Level Processed Stack Package (WSP), etc.

Refresh controller 1300 controls the refresh operation of the dynamic latch. As described above, the page buffer according to the embodiments includes the dynamic latch (e.g., dynamic latch DL1 of FIG. 2). Therefore, in order to program the memory cells in memory cell array 110 using the data stored in the dynamic latch, periodic refresh operations are performed on the dynamic latch. The refresh operation of refresh controller 1300 is described below in further detail. In certain embodiments, refresh controller 1300 is disposed in nonvolatile memory chip 1100, as shown in FIG. 13.

Figure 14:
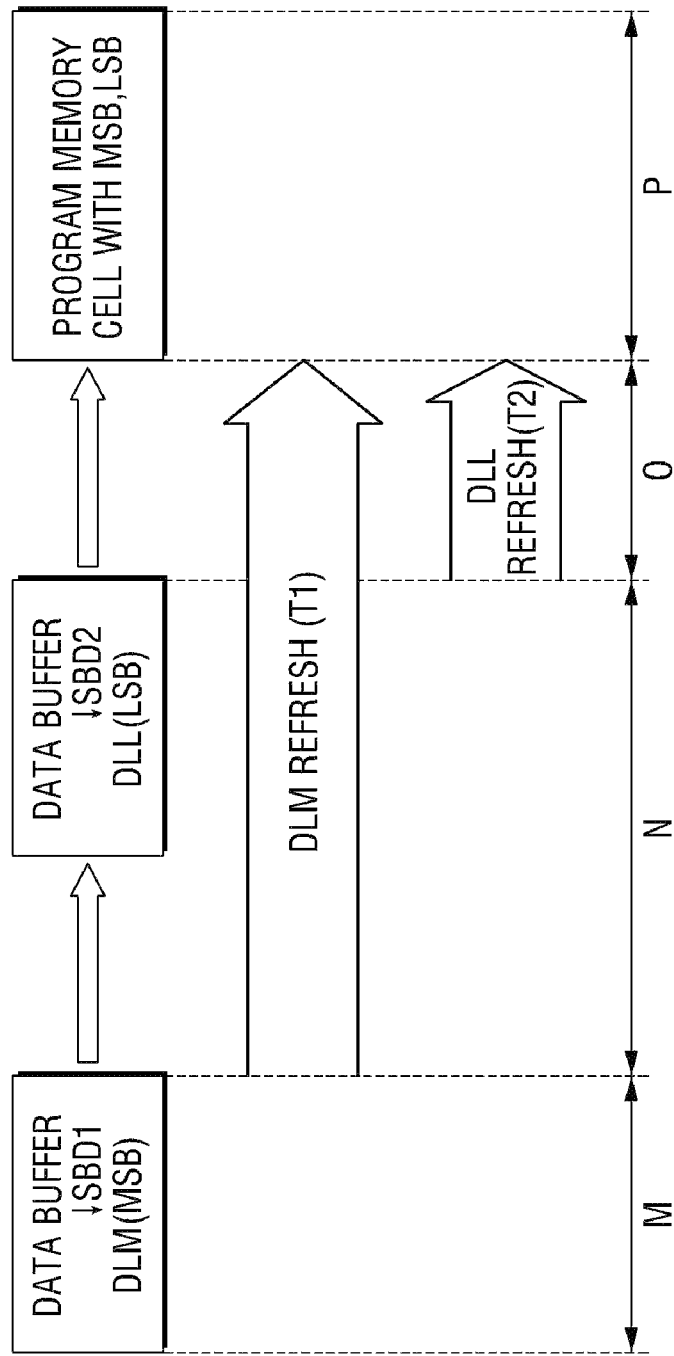
FIG. 14 is a timing diagram illustrating a refresh operation of the nonvolatile memory device of FIG. 12.
Figure 15:
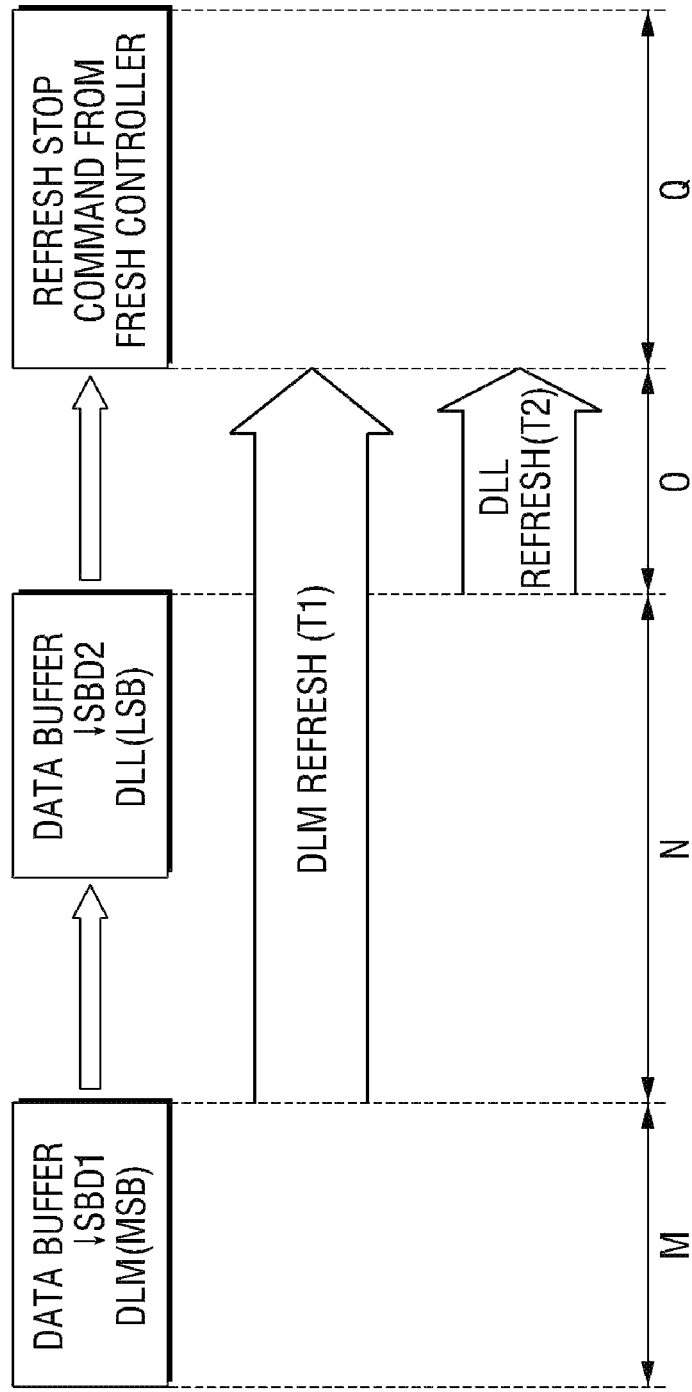
FIG. 15 is a timing diagram illustrating another refresh operation of the nonvolatile memory device of FIG. 12.
Figure 16:
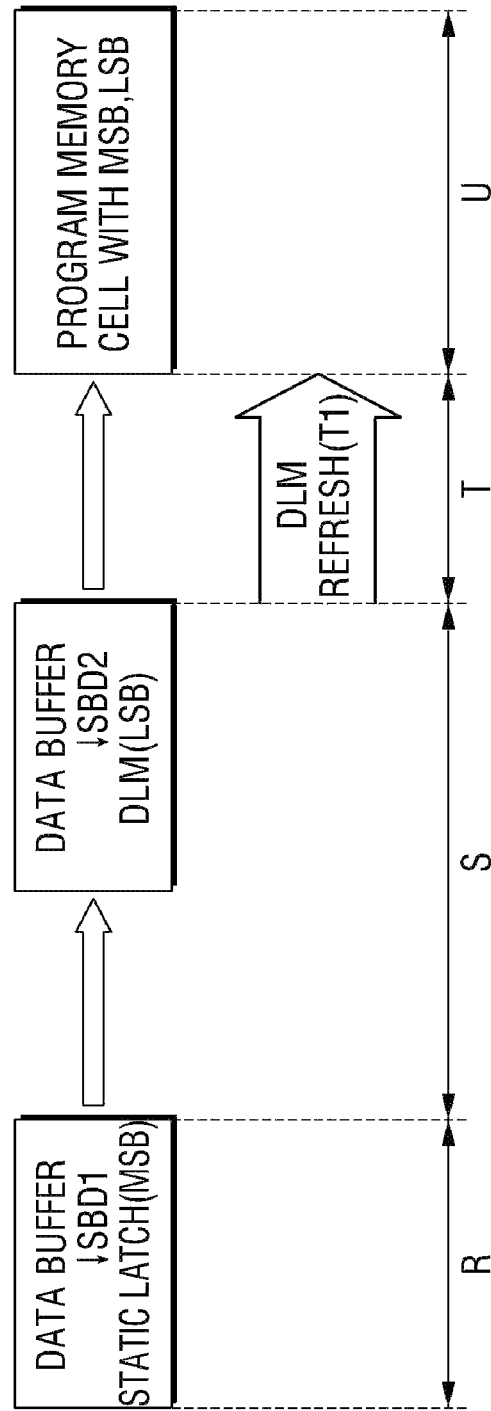
FIG. 16 is a timing diagram illustrating another refresh operation of the nonvolatile memory device of FIG. 12.

FIGS. 14 to 16 illustrate a refresh operation of the nonvolatile memory device of FIG. 12. The refresh operation of nonvolatile memory device 1000 will be described with reference to nonvolatile memory chip 1100 including the page buffer of FIG. 12, although the described concepts are not limited to this particular hardware configuration.

First, referring to FIGS. 12 to 14, externally supplied first single bit data SBD1 is stored in the first dynamic latch DLM (section "M") through the data buffer. The first single bit data SBD1 stored in the first dynamic latch DLM is first bit data to be programmed in the memory cell included in the memory cell array. Therefore, the first single bit data SBD1 should be retained in the first dynamic latch DLM until a program command is received from device controller 1200.

Accordingly, refresh controller 1300 performs a refresh operation on the first dynamic latch DLM immediately after first single bit data SBD1 is stored in first dynamic latch DLM (i.e., in sections "N" to "O"). Although not specifically shown in FIG. 13, refresh controller 1300 typically comprises a timer that obtains a refresh time period (T1) and may repeatedly perform refresh operations on the first dynamic latch DLM for each time period T1 obtained by the timer.

Next, externally supplied second single bit data SBD2 is stored in second dynamic latch DLL through the data buffer (section "N" section). The second single bit data SBD2 stored in the second dynamic latch DLL is second bit data to be programmed in the memory cell included in the memory cell array. Therefore, the second single bit data SBD2 is retained in the second dynamic latch DLL until a program command is received from device controller 1200.

Refresh controller 1300 performs a refresh operation on the second dynamic latch DLL immediately after the second single bit data SBD2 is stored in the second dynamic latch DLL (section "O"). Similar to the case of the first single bit data SBD1 stored in the first dynamic latch DLM, although not specifically shown in FIG. 13, refresh controller 1300 may include a timer that obtains a refresh time period (T2) and may repeatedly perform refresh operations on the second dynamic latch DLL for each time period T2 obtained by the timer.

In some embodiments, the refresh time period T1 for the first dynamic latch DLM and the refresh time period T2 for the second dynamic latch DLL may be equal to each other, but aspects of the inventive concept are not limited thereto.

Next, after the first single bit data SBD1 and the second single bit data SBD2 are stored in the first and second dynamic latches DLM and DLL, device controller 1200 applies a program command to nonvolatile memory chip 1100 and programs the memory cell using the data stored in the first and second dynamic latches DLM and DLL (P section). As a result, 2-bit data is programmed in the memory cell, the 2-bit data having the data stored in the first dynamic latch DLM as first bit data and the data stored in the second dynamic latch DLL as second bit data.

For the sake of convenience, the illustrated embodiment has shown that 2-bit data having first bit data and second bit data is programmed in the memory cell, but aspects of the inventive concept are not limited thereto. In some other embodiments, 3-bit data is programmed in the memory cell, the 3-bit data having first bit data, second bit data, and third bit data. In this case, the page buffer is modified to include a first dynamic latch DLM, a second dynamic latch DLC, and a third dynamic latch DLL.

The refresh time periods (sections "N" to "O") for the first and second dynamic latches DLM and DLL may be unduly extended according to operating conditions. For example, first and second single bit data SBD1 and SBD2 may be stored in the first and second dynamic latches DLM and DLL, respectively. However, in some circumstances, the program command may not be supplied from device controller 1200 to nonvolatile memory chip 1100 due to a change in operating conditions. If the refresh operations for the first and second dynamic latches DLM and DLL are performed, power consumption may be unnecessarily increased. Therefore, where the refresh operations for dynamic latches DLM and DLL are not additionally required, refresh controller 1300 generates a refresh interruption command and outputs the same, as shown in FIG. 15 (section "Q"). In operating refresh controller 1300, unnecessary power consumption associated with refresh operations can be reduced.

Referring to FIGS. 12, 13 and 16, externally supplied first single bit data SBD1 is stored in static latch S through the data buffer (section "R"). First single bit data SBD1 stored in static latch S is first bit data to be programmed in the memory cell included in the memory cell array. However, because the first bit data is stored in static latch S, it is retained in static latch S until a program command is received from device controller 1200 even if a separate refresh operation is not performed. Therefore, no separate refresh operation is required.

Next, externally supplied second single bit data SBD2 is stored in the first dynamic latch DLM through the data buffer (section "S"). The second single bit data SBD1 stored in the first dynamic latch DLM is second bit data to be programmed in the memory cell included in the memory cell array. However, because the second bit data is stored in static latch S, it is retained in the first dynamic latch DLM until a program command is received from device controller 1200 only after a refresh operation is performed on the first dynamic latch DLM. Therefore, refresh controller 1300 performs refresh operations on the first dynamic latch DLM immediately after the second single bit data SBD2 is stored in the first dynamic latch DLM (section "T"). Here, refresh controller 1300 comprises a timer that obtains a refresh time period T1 and may repeatedly perform the refresh operation on the second dynamic latch DLM for each time period T1 obtained by the timer.

After the first single bit data SBD1 and the second single bit data SBD2 are stored in static latch S and the first dynamic latch DLM, respectively, device controller 1200 applies a program command to nonvolatile memory chip 1100 and programs the memory cell using the data stored in static latch S and the first dynamic latch DLM (section "U"). As a result, 2-bit data is programmed in the memory cell, the 2-bit data having the data stored in static latch S as first bit data and the data stored in the first dynamic latch DLM as second bit data.

Where nonvolatile memory device 1000 operates in the above-described manner, no refresh operation is performed until the second bit data is stored in the page buffer. Therefore, unnecessary power consumption associated with the refresh operation can be reduced.

Figure 17:
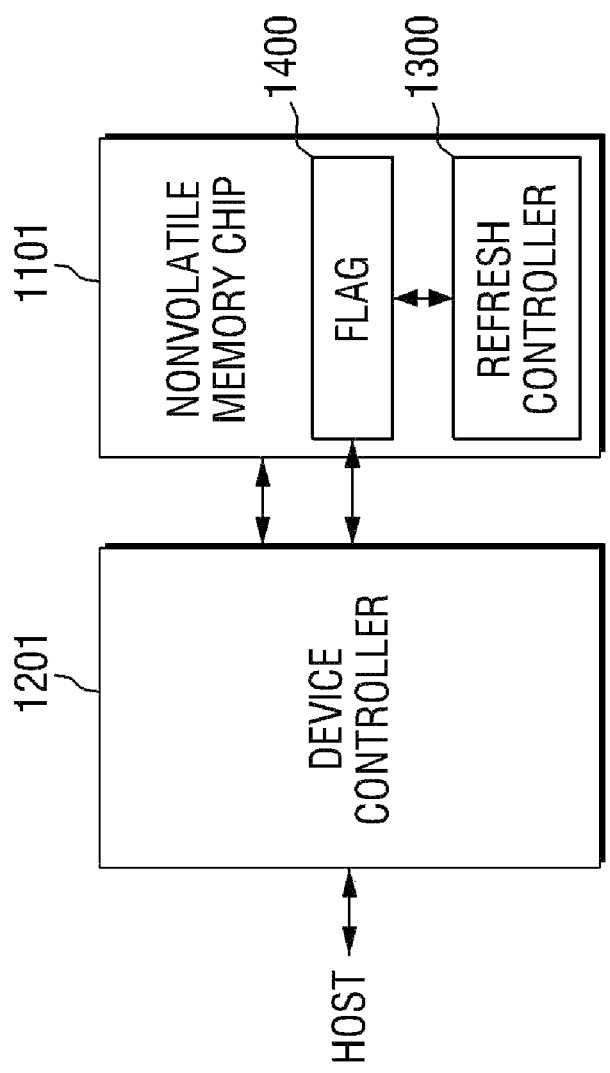
FIG. 17 is a block diagram of a nonvolatile memory device according to another embodiment of the inventive concept.

FIG. 17 is a block diagram of a nonvolatile memory device according to another embodiment of the inventive concept. To avoid redundancy, the following description will focus on features that are different from those described above in relation to other embodiments.

Referring to FIGS. 12 and 17, nonvolatile memory device 1001 further comprises a flag 1400. Here, flag 1400 may have one of a first state (e.g., H) and a second state (e.g., L).

A refresh controller 1300 changes a state of flag 1400 whenever refresh operations for dynamic latches DLM and DLL are performed. Therefore, where an odd number of refresh operations, for example, are performed on dynamic latches DLM and DLL, flag 1400 may have a first state (e.g., H). in a case where an even number of refresh operations are performed on dynamic latches DLM and DLL, flag 1400 may have a second state (e.g., L).

Meanwhile, a page buffer included in nonvolatile memory chip 1101 performs only first refresh operation REFRESH 1 of FIG. 9, thereby completing the refresh operations for dynamic latches DLM and DLL. That is to say, the page buffer in nonvolatile memory chip 1101 does not perform the first and second refresh operations REFRESH 1 and 2 of FIG. 9 but performs only first refresh operation REFRESH 1, thereby completing the refresh operations for dynamic latches DLM and DLL.

In this case, as described above, levels of the data stored in dynamic latches DLM and DLL are changed whenever a refresh operation is performed. Therefore, when the memory cell is programmed using the data stored in dynamic latches DLM and DLL (section "P" of FIG. 14), it is necessary to determine whether to change the levels of the data stored in dynamic latches DLM and DLL.

Figure 18:
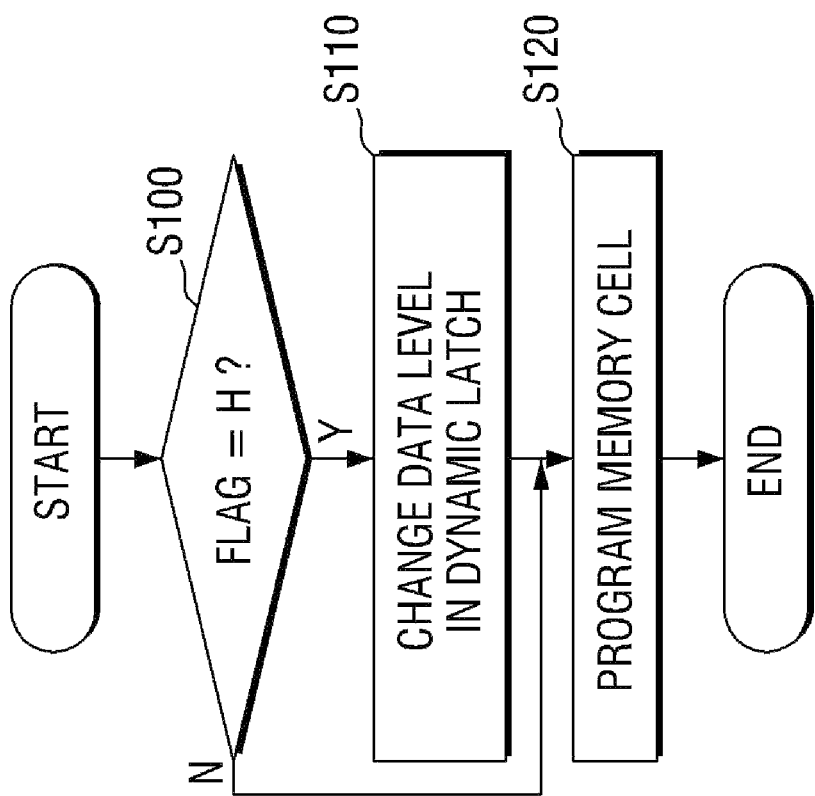
FIG. 18 is a flowchart illustrating a refresh operation of the nonvolatile memory device of FIG. 17.

FIG. 18 is a flowchart illustrating a refresh operation of the nonvolatile memory device of FIG. 17.

Referring to FIG. 18, where the memory cell is programmed using the data stored in dynamic latches DLM and DLL (section "P" of FIG. 14), a state of flag 1400 is first identified (S100). Where flag 1400 has a first state (e.g., H), the data stored in dynamic latches DLM and DLL have a state in which the data levels are changed by the refresh operation, the levels of the data stored in dynamic latches DLM and DLL are changed (S110). Then, the memory cell is programmed using the level changed data (S120).

On the other hand, where flag 1400 has a second state (e.g., L), the data stored in dynamic latches DLM and DLL may have a state in which the data levels are not changed by the refresh operation, the memory cell is programmed using the data stored in dynamic latches DLM and DLL without changing data levels (S120).

Figure 19:
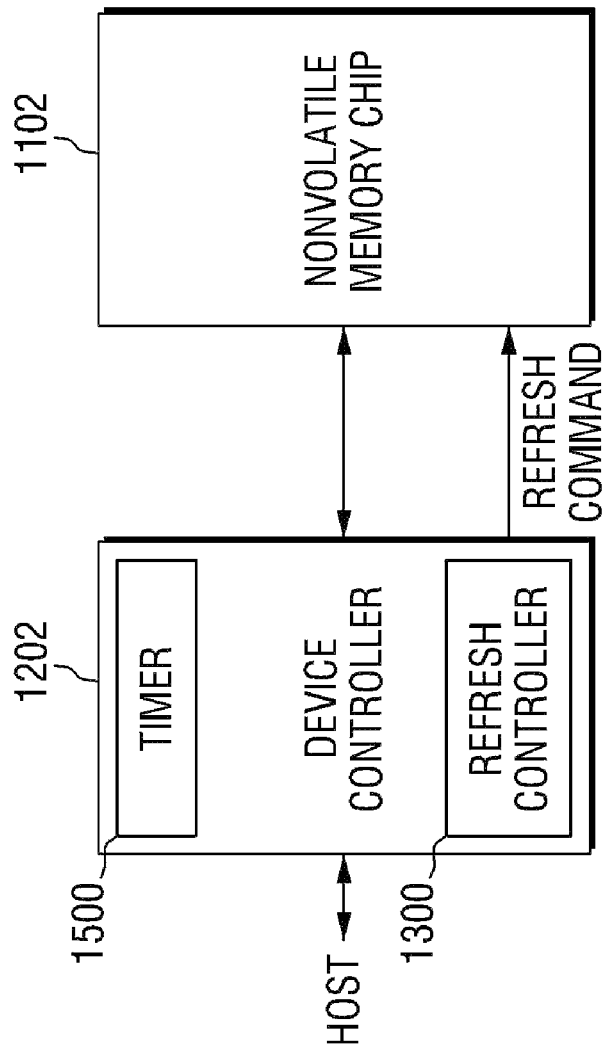
FIG. 19 is a block diagram of a nonvolatile memory device according to still another embodiment of the inventive concept.

FIG. 19 is a block diagram of a nonvolatile memory device according to still another embodiment of the inventive concept. To avoid redundancy, the description of FIG. 19 will focus on features that are different than those described in relation to other embodiments.

Referring to FIGS. 12 and 19, nonvolatile memory device 1002 comprises a nonvolatile memory chip 1102, a device controller 1202 and a refresh controller 1300.

In this embodiment, refresh controller 1300 is disposed within device controller 1202. Where refresh operations should be performed on dynamic latches DLM and DLL, refresh controller 1300 disposed within device controller 1202 supplies a refresh command REFRESH COMMAND to nonvolatile memory chip 1102.

Meanwhile, device controller 1202 comprises a timer 1500. Timer 1500 may be used in determining whether to perform the refresh operations on dynamic latches DLM and DLL included in nonvolatile memory chip 1102, as described below with reference to FIGS. 20 and 21.

Figure 20:
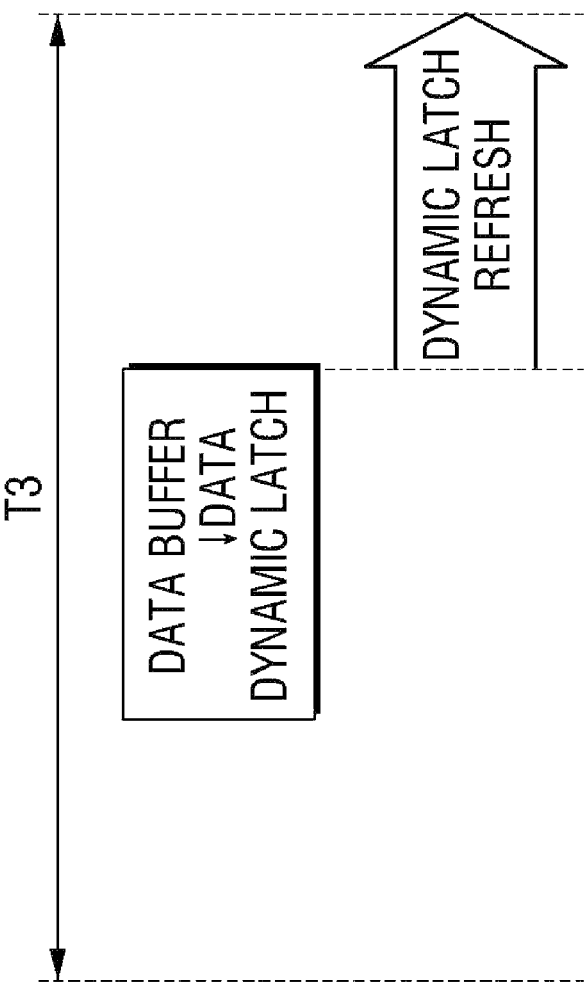
FIG. 20 is a timing diagram illustrating a refresh operation of the nonvolatile memory device of FIG. 19.
Figure 21:
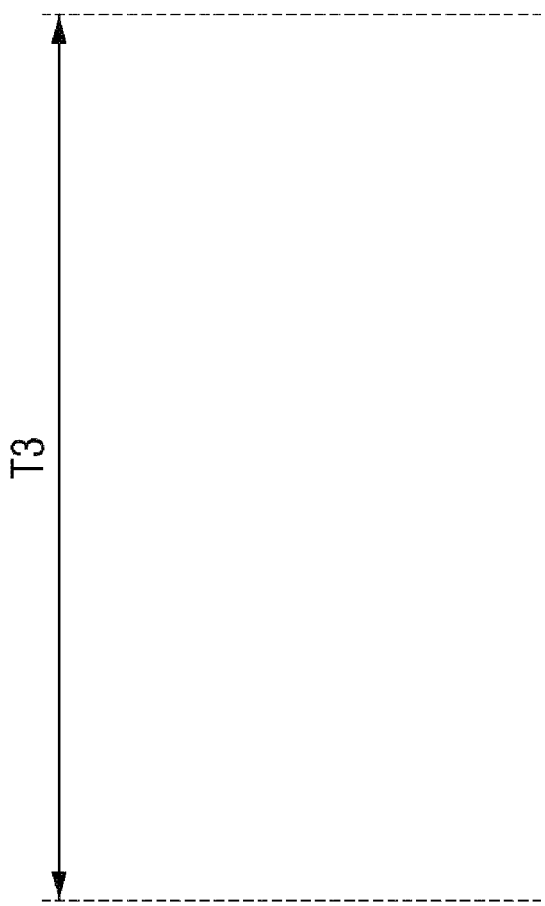
FIG. 21 is a timing diagram illustrating a refresh operation of the nonvolatile memory device of FIG. 19.

FIGS. 20 and 21 illustrate a refresh operation of the nonvolatile memory device of FIG. 19.

Referring to FIG. 20, device controller 1202 checks whether data is supplied from the data buffer to dynamic latches DLM and DLL in nonvolatile memory chip 1102 for a predetermined time period T3 obtained by timer 1500. Where the data is supplied from the data buffer to dynamic latches DLM and DLL in nonvolatile memory chip 1102 within the predetermined time period T3, as shown in FIG. 20, refresh controller 1300 outputs refresh command REFRESH COMMAND for dynamic latches DLM and DLL to nonvolatile memory chip 1102. Accordingly, the refresh operation for dynamic latches DLM and DLL are performed.

However, as shown in FIG. 21, as the checking result of device controller 1202, if the data is not supplied from the data buffer to dynamic latches DLM and DLL within the predetermined time period T3, refresh controller 1300 performs the refresh operations on dynamic latch DLM and DLL. Refresh controller 1300 does not output refresh command REFRESH COMMAND for dynamic latches DLM and DLL to nonvolatile memory chip 1102. Accordingly, the refresh operations for dynamic latches DLM and DLL are not further performed.

Where the data is not supplied from the data buffer to the page buffer within the predetermined period time T3 due to a change in the operating condition, the data previously supplied to the page buffer may not be programmed at it is but may be newly updated or discarded.

Therefore, in nonvolatile memory device 1002 according to the present embodiment, if the data is not supplied from the data buffer to the page buffer within the predetermined period time T3, a refresh operation on the data previously supplied to the page buffer is not necessarily performed, thereby reducing unnecessary power consumption.

Figure 22:
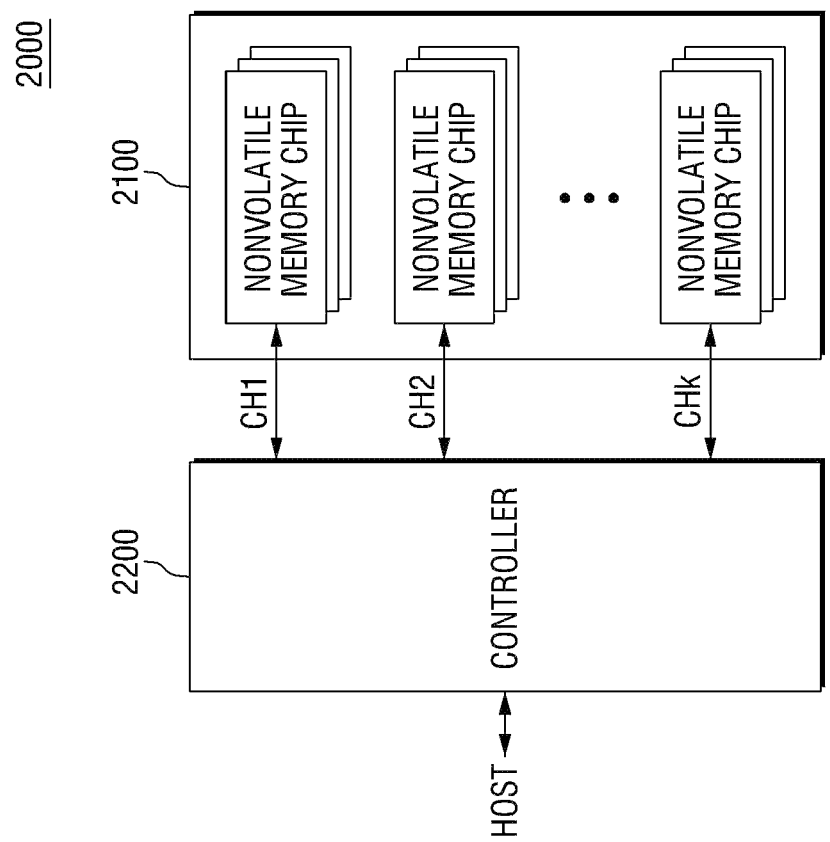
FIG. 22 is a block diagram of a system comprising a nonvolatile memory device according to an embodiment of the inventive concept.

FIG. 22 is a block diagram illustrating a system comprising a nonvolatile memory device according to an embodiment of the inventive concept.

Referring to FIG. 22, a memory system 2000 comprises a nonvolatile memory device 2100 and a controller 2200. Nonvolatile memory device 2100 may be implemented using a plurality of nonvolatile memory chips, which are divided into a plurality of groups. The nonvolatile memory chips in each group may be configured to communicate with controller 2200 via one common channel. In FIG. 18, for example, the plurality of nonvolatile memory chips communicates with controller 2200 via a plurality of channels CH1 to CHk.

FIG. 22 illustrates that a plurality of nonvolatile memory chips are connected to a single channel. However, in some embodiments of the inventive concept, memory system 2000 may be modified such that one nonvolatile memory chip is connected to one channel.

Figure 23:
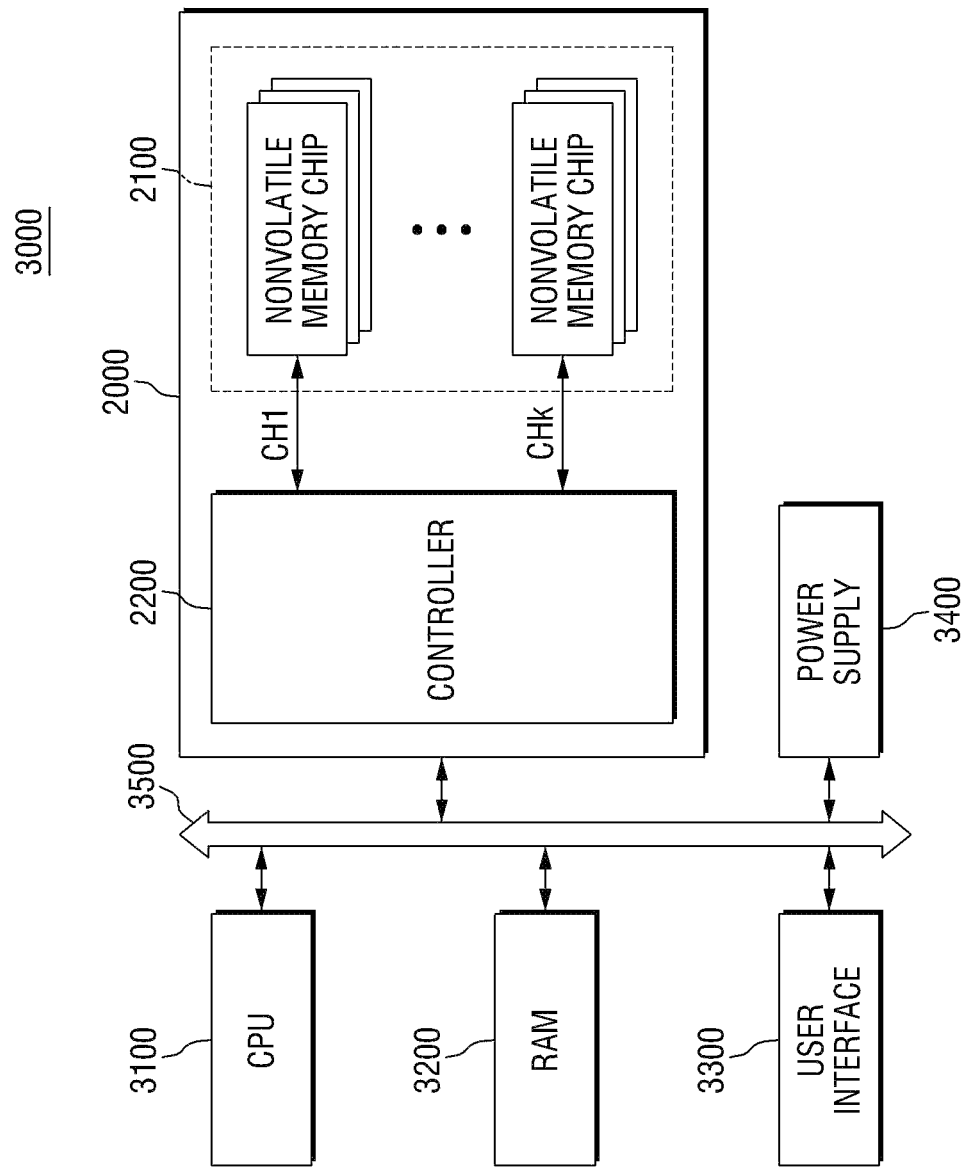
FIG. 23 is a block diagram illustrating a computing system comprising a nonvolatile memory device according to an embodiment of the inventive concept.

FIG. 23 is a block diagram illustrating a computing system comprising a nonvolatile memory device according to an embodiment of the inventive concept.

Referring to FIG. 23, computing system 3000 comprises a central processing unit (CPU) 3100, a random access memory (RAM) 3200, a user interface 3300, a power supply 3400, and memory system 2000.

Memory system 2000 is electrically connected to CPU 3100, RAM 3200, user interface 3300, and power supply 3400 through a system bus 3500. Data provided through user interface 3300 or processed by CPU 3100 is stored in memory system 2000.

In FIG. 23, nonvolatile memory device 2100 is connected to system bus 3500 through controller 2200. However, nonvolatile memory device 2100 may also be configured to be directly connected to system bus 3500.

Examples of computing system 3000 may include, without limitation, a computer, an ultra-mobile PC (UMPC), a workstation, a net-book, a personal digital assistant (PDA), a portable computer, a web tablet, a wireless phone, a mobile phone, a smart phone, an e-book, a portable multimedia player (PMP), a portable game device, a navigation device, a black box, a digital camera, a 3-dimensional television, a digital audio recorder/player, digital picture/video recorder/player, a device capable of transmitting and receiving information via wireless communication, one of various electronic devices constituting a home network, one of various electronic devices constituting a computer network, one of various electronic devices constituting a telematics network, RFID, or one of various electronic devices constituting a computing system.

The foregoing is illustrative of embodiments and is not to be construed as limiting thereof. Although a few embodiments have been described, those skilled in the art will readily appreciate that many modifications are possible in the embodiments without materially departing from the novel teachings and advantages of the inventive concept. Accordingly, all such modifications are intended to be included within the scope of the inventive concept as defined in the claims.

What is claimed is:

1. A method of operating a nonvolatile memory device comprising a nonvolatile memory chip comprising a static latch, first and second dynamic latches that receive data stored in the static latch through a floating node, and a memory cell configured to store multi-bit data, the method comprising:
   performing a refresh operation on the first dynamic latch where externally supplied first single bit data is stored in the first dynamic latch;
   performing a refresh operation on the second dynamic latch where externally supplied second single bit data is stored in the second dynamic latch; and
   programming the memory cell using the data stored in the first and second dynamic latches after the first and second single bit data are stored in the respective first and second dynamic latches,
   wherein the performing a refresh operation on the first dynamic latch includes:
   charging the floating node;
   developing the floating node according to a voltage level of a storage node in the first dynamic latch; and
   developing the storage node according to a voltage level of the floating node.

2. The method of claim 1, wherein the refresh operations for the first and second dynamic latches are repeated periodically.

3. The method of claim 1, further comprising interrupting the refresh operations for the first and second dynamic latches upon determining that data is not stored in the first and second dynamic latches for a predetermined time.

4. The method of claim 1, further comprising, before the storing of the first single bit data, storing externally supplied third single bit data in the first dynamic latch.

5. A nonvolatile memory device, comprising
   a nonvolatile memory chip comprising a static latch and a dynamic latch that receives data stored in the static latch through a floating node; and
   a refresh controller that controls a refresh operation of the dynamic latch,
   wherein the dynamic latch comprises a storage capacitor, a write transistor that writes the data of the floating node to the storage capacitor, and a read transistor that reads the data of the storage capacitor, and the write transistor and the read transistor share the floating node.

6. The nonvolatile memory device of claim 5, further comprising:
   a device controller that controls operation of the nonvolatile memory chip.

7. The nonvolatile memory device of claim 6, wherein the refresh controller is disposed in the nonvolatile memory chip.

8. The nonvolatile memory device of claim 7, wherein the nonvolatile memory chip further comprises a memory cell configured to store multi-bit data, the dynamic latch comprises first and second dynamic latches,
   wherein the refresh controller performs a refresh operation on the first dynamic latch where externally supplied first single bit data is stored in the first dynamic latch and performs a refresh operation on the second dynamic latch where externally supplied second single bit data is stored in the second dynamic latch, and
   wherein the device controller programs the memory cell using the data stored in the first and second dynamic latches after the first and second single bit data are stored in the first and second dynamic latches.

9. The nonvolatile memory device of claim 8, wherein the refresh controller comprises a timer, and the refresh operations for the first and second dynamic latches are repeated for every predetermined time period obtained by the timer.

10. The nonvolatile memory device of claim 7, wherein the data comprises first level data and second level data different from the first level data, and the first level data stored in the storage node is changed into the second level data through the first refresh operation.

11. The nonvolatile memory device of claim 10, wherein the second level data stored in the storage node through the first refresh operation is changed into the first level data through the second refresh operation performed after the first refresh operation.

12. The nonvolatile memory device of claim 7, wherein where an additional refresh operation for the dynamic latch is not required, the refresh controller generates and outputs a refresh interruption command.

13. The nonvolatile memory device of claim 7, wherein the nonvolatile memory chip further comprises a memory cell capable of storing multi-bit data,
wherein the refresh controller periodically performs a refresh operation on the dynamic latch if the externally supplied second single bit data is stored in the second dynamic latch after the externally supplied first single bit data is stored in the dynamic latch, and
wherein the device controller programs the memory cell using the data stored in the static and dynamic latches after the second single bit data is stored in the dynamic latches.

14. The nonvolatile memory device of claim 6, wherein the refresh controller is disposed in the device controller and a refresh command for the dynamic latch is supplied from the device controller to the nonvolatile memory chip.

15. The nonvolatile memory device of claim 14, wherein the device controller comprises a timer, and the refresh command for the dynamic latch is supplied from the device controller to the nonvolatile memory chip only where the data is stored in the dynamic latch for a predetermined time period determined by the timer.

16. The nonvolatile memory device of claim 6, further comprising a flag having one of a first state and a second state, wherein the nonvolatile memory chip comprises a memory cell capable of storing data, the refresh controller changes a state of the flag whenever a refresh operation for the dynamic latch is performed, and the device controller programs the memory cell using the data stored in the dynamic latch if the state of the flag is the first state, and changes a level of the data stored in the dynamic latch and programs the memory cell using the level-changed data if the state of the flag is the second state.

17. A method of operating a nonvolatile memory device comprising a static latch and a dynamic latch, comprising:
storing data in the static latch; and
transferring the data stored in the static latch to the dynamic latch via a floating node, wherein the dynamic latch comprises a storage capacitor, a write transistor that writes the data of the floating node to the storage capacitor, and a read transistor that reads the data of the storage capacitor, and the write transistor and the read transistor share the floating node,
wherein the nonvolatile memory device further comprises a nonvolatile memory chip containing the dynamic latch and the static latch, a device controller that controls operation of the nonvolatile memory chip, and a refresh controller that controls a refresh operation of the dynamic latch and is located in the nonvolatile memory chip.

18. The method of claim 17, wherein the nonvolatile memory chip further comprises a memory cell configured to store multi-bit data, the dynamic latch comprises first and second dynamic latches, wherein the refresh controller performs a refresh operation on the first dynamic latch where externally supplied first single bit data is stored in the first dynamic latch and performs a refresh operation on the second dynamic latch where externally supplied second single bit data is stored in the second dynamic latch, and wherein the device controller programs the memory cell using the data stored in the first and second dynamic latches after the first and second single bit data are stored in the first and second dynamic latches.

19. The method of claim 17, wherein the nonvolatile memory chip further comprises a memory cell capable of storing multi-bit data, wherein the refresh controller periodically performs a refresh operation on the dynamic latch if the externally supplied second single bit data is stored in the second dynamic latch after the externally supplied first single bit data is stored in the dynamic latch, and wherein the device controller programs the memory cell using the data stored in the static and dynamic latches after the second single bit data is stored in the dynamic latches.

* * * * *